United States Patent
Inuiya

(10) Patent No.: US 8,223,234 B2
(45) Date of Patent: Jul. 17, 2012

(54) SOLID-STATE IMAGING DEVICE AND IMAGING APPARATUS HAVING PIXELS PORTIONS OVER A SUBSTRATE

(75) Inventor: Masafumi Inuiya, Kanagawa (JP)

(73) Assignee: Fujifilm Corporation (JP)

( * ) Notice: Subject to any disclaimer, the term of this patent is extended or adjusted under 35 U.S.C. 154(b) by 392 days.

(21) Appl. No.: 12/557,821

(22) Filed: Sep. 11, 2009

(65) Prior Publication Data

US 2010/0060756 A1    Mar. 11, 2010

(30) Foreign Application Priority Data

Sep. 11, 2008 (JP) ................ P2008-233318

(51) Int. Cl.
*H04N 3/14* (2006.01)
*H04N 5/335* (2011.01)
(52) U.S. Cl. ............... 348/294; 257/291; 257/440
(58) Field of Classification Search .......... 348/294, 348/340, 280; 257/184, 187, 225, 229–231, 257/432, 440, 257–258; 438/70
See application file for complete search history.

(56) References Cited

U.S. PATENT DOCUMENTS

| 2007/0045520 A1* | 3/2007 | Mitsui ............... 250/214 R |
| 2007/0096232 A1* | 5/2007 | Hwang ............... 257/431 |
| 2008/0079807 A1* | 4/2008 | Inuiya et al. ........... 348/70 |

FOREIGN PATENT DOCUMENTS

JP    2005-347475 A    12/2005

\* cited by examiner

*Primary Examiner* — Nelson D. Hernández
(74) *Attorney, Agent, or Firm* — Studebaker & Brackett PC; Donald R. Studebaker

(57) ABSTRACT

A solid-state imaging device includes a substrate and a plurality of pixel portions arranged over the substrate, each of the pixel portions includes a photoelectric conversion portion provided over the substrate and a color filter provided over the photoelectric conversion portion, the solid-state imaging device includes partitions provided between the color filters of the adjoining pixel portions so as to cover side surfaces of the color filters, each of the photoelectric conversion portions includes a lower electrode provided over the substrate, an upper electrode provided over the lower electrode, and a photoelectric conversion layer provided between the lower electrode and the upper electrode, each of the pixel portions further includes a protective layer provided between the color filter and the upper electrode, and the protective layer has a thickness of greater than 0 μm and smaller than or equal to 1.0 μm.

9 Claims, 22 Drawing Sheets

WITHOUT PARTITIONS

WITH PARTITIONS

F-NUMBER DEPENDENCE (INCIDENT ANGLE: 0°)

WITHOUT PARTITIONS

F-NUMBER DEPENDENCE (INCIDENT ANGLE: 0°)

WITH PARTITIONS

SOLID-STATE IMAGING DEVICE AND IMAGING APPARATUS HAVING PIXELS PORTIONS OVER A SUBSTRATE

CROSS-REFERENCE TO RELATED APPLICATIONS

This application claims the benefit of Japanese Patent Application JP 2008-233318, filed Sep. 11, 2008, the entire content of which is hereby incorporated by reference, the same as if set forth at length.

FIELD OF THE INVENTION

The present invention relates to a solid-state imaging device having many pixel portions arranged over a substrate and an imaging apparatus having such a solid-state imaging device.

BACKGROUND OF THE INVENTION

Stacked color imaging devices are known which have a layer of an organic photoelectric conversion material or an inorganic photoelectric conversion material such as amorphous silicon or a compound semiconductor and mosaic color filters disposed over the photoelectric conversion layer (refer to JP-A-2005-347475 and Hitachi, Ltd., "Single-plate Color Solid-state Imaging Device Using Amorphous Si," ITEJ Technical Report TEBS76-1-1). The photoelectric conversion layer absorbs visible light and generates signal charges.

In such stacked color imaging devices, what is called a panchromatic photoelectric conversion layer which is sensitive in the entire visible range is sandwiched between pixel electrodes and a transparent counter electrode and mosaic color filters are laid on the transparent counter electrode with a protective layer interposed in between. The mosaic filters are an arrangement of color filters that correspond to the respective pixel portions and each of which transmits R, G, or B light or Cy, Mg, or Ye light. Light shining on the imaging device is separated by the mosaic filters on a pixel-by-pixel basis into R, G, and B light beams or Cy, Mg, and Ye light beams, which are converted into signal charges by the photoelectric conversion layer. The signal charges generated by the photoelectric conversion layer are collected by the pixel electrodes, stored in charge storage diodes formed in a silicon substrate for a prescribed time via plugs that are connected to the pixel electrodes, and read out by readout circuits such as CMOS circuits or a CCD.

In such stacked color imaging devices, potential gradients are formed by applying a bias voltage between the pixel electrodes and the transparent counter electrode and almost all of signal charges generated in the photoelectric conversion layer are read out to the pixel electrode side. Therefore, a high-sensitivity imaging device having high efficiency of light utilization (the aperture ratio is close to 1) by setting the gaps between the pixel electrodes small. However, if there exists a certain distance between the photoelectric conversion layer and the mosaic color filters, light that is incident on each pixel portion obliquely may leak into adjacent pixel portions to cause color contamination.

Conventional stacked color imaging devices in which each pixel portion measures 3 to 10 μm for the mosaic color filters, the protective layer, and the panchromatic photoelectric conversion layer being 0.6 to 1.2 μm, 0.2 to 0.5 μm, and 0.3 to 1.0 μm in thickness, respectively, rarely suffer color contamination because of a small ratio of leakage of oblique incident light into adjacent pixel portions. However, the problem of color contamination will not be negligible when the degree of miniaturization of the pixel portions is increased and each pixel portion comes to measure less than 2 μm, in particular, around 1 μm, in the future.

SUMMARY OF THE INVENTION

The present invention has been made in the above circumstances, and an object of the invention is therefore to provide a solid-state imaging device in which the color contamination can be suppressed to such a level as to cause no problems in practice even in the case where the size of each pixel portion is as small as around 1 μm, as well as an imaging apparatus having such a solid-state imaging device.

The solid-state imaging device according to the invention is a solid-state imaging device having many pixel portions which are arranged over a substrate, wherein each of the pixel portions comprises a photoelectric conversion portion provided over the substrate and a color filter provided over the photoelectric conversion portion; the solid-state imaging device comprises partitions for preventing light that is incident on the color filter of each pixel portion from entering adjacent pixel portions; the partitions are provided between the color filters of the adjoining pixel portions so as to cover side surfaces of the color filters; each of the photoelectric conversion portions comprises a lower electrode provided over the substrate, an upper electrode provided over the lower electrode, and a photoelectric conversion layer provided between the lower electrode and the upper electrode; each of the pixel portions further comprises a protective layer provided between the color filter and the upper electrode, for protecting the photoelectric conversion portion; and the thickness of the protective layer is greater than 0 μm and smaller than or equal to 1.0 μm.

In the solid-state imaging device according to the invention, the width of each of the partitions in a direction that is parallel with surfaces of the color filters is in a range of 0.05 μm to 0.2 times a size of each pixel portion; and a sum of the thickness of the color filters and the thickness of the protective layer is greater than 0.2 μm and smaller than or equal to 1.4 μm.

In the solid-state imaging device according to the invention, the partitions are made of a light absorbing or reflecting material or are air layers that reflect light totally.

In the solid-state imaging device according to the invention, the lower electrode is deviated outward more from the color filter of the same pixel portion as the position of the lower electrode goes away from the center of the solid-state imaging device.

In the solid-state imaging device according to the invention, the lower electrode is deviated outward so that a light ray that originates from the center of an exit pupil of an imaging lens of an imaging apparatus incorporating the solid-state imaging device and passes through the center of the color filter of the pixel portion reaches the center of a portion of the photoelectric conversion layer that is sandwiched between the lower electrode and the upper electrode of the same pixel portion.

In the solid-state imaging device according to the invention, the deviation of the center of the lower electrode from the center of the color filter of the same pixel portion is longer than or equal to 0.303T/L times a distance between an intersection of the light ray and a top surface of the solid-state imaging device and an optical axis of the imaging lens and shorter than or equal to 0.909T/L times the distance between the intersection of the light ray and the surface of the solid-state imaging device and the optical axis of the imaging lens, where L is a distance between the exit pupil of the imaging lens and the top surface of the solid-state imaging device and T is a distance between the center of the color filter and a center plane of the photoelectric conversion layer.

In the solid-state imaging device according to the invention, the photoelectric conversion layer is made of a photoelectric conversion material that absorbs visible light and generates signal charges corresponding to an amount of the absorbed light; and the color filters of the pixel portions include three or more kinds of color filters that transmit light components in different wavelength ranges.

In the solid-state imaging device according to the invention, the photoelectric conversion layer is made of an organic or inorganic photoelectric conversion material.

In the solid-state imaging device according to the invention, each of the pixel portions further comprises a microlens provided on the color filter, for focusing light in the photoelectric conversion portion.

The imaging apparatus according to the invention comprises any of the above solid-state imaging devices.

The invention can provide a solid-state imaging device in which the color contamination can be suppressed to such a level as to cause no problems in practice even in the case where the size of each pixel portion is as small as around 1 μm, as well as an imaging apparatus having such a solid-state imaging device.

DETAILED DESCRIPTION OF THE INVENTION

A solid-state imaging device according to an embodiment of the present invention will be hereinafter described with reference to the drawings. This solid-state imaging device is for use in imaging apparatus such as digital cameras and digital video cameras.

Figure 1A:
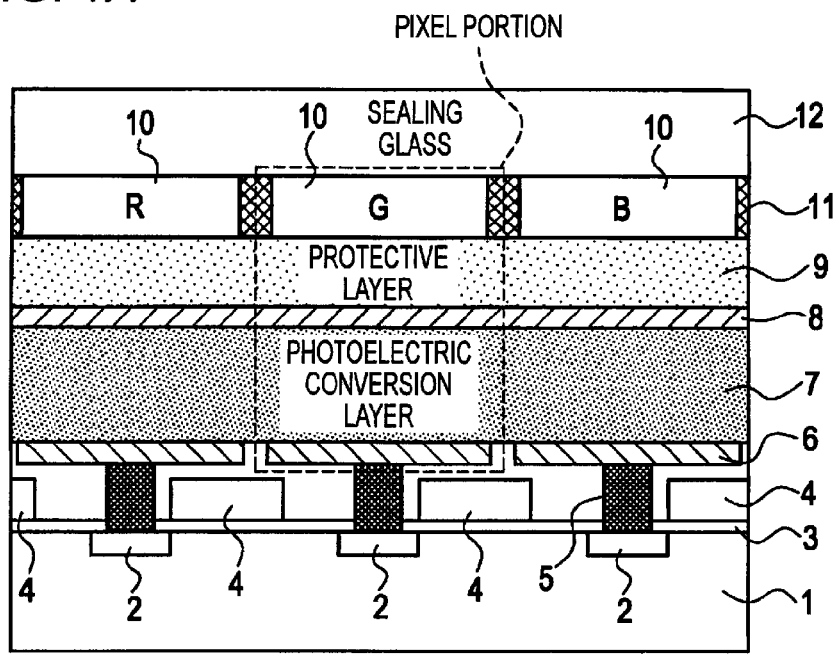
FIG. 1A is a schematic sectional view showing a general configuration of a solid-state imaging device according to an embodiment of the present invention and FIG. 1B is a circuit diagram showing an example configuration of each signal readout circuit shown in FIG. 1A.

FIG. 1A is a schematic sectional view showing a general configuration of the solid-state imaging device according to the embodiment of the invention. In the solid-state imaging device of FIG. 1A, many pixel portions are disposed over a p-type silicon substrate 1 (an example of the term "substrate" as used in the claims) so as to be arranged two-dimensionally (e.g., in square matrix) or one-dimensionally. For example, the pixel portions are rectangular in shape. FIG. 1A includes a cross section of three pixel portions that are arranged in a prescribed direction.

Each pixel portion is provided with a photoelectric conversion portion including a lower electrode 6 disposed over the p-type silicon substrate 1, an upper electrode 8 disposed over the lower electrode 6, and a photoelectric conversion layer 7 disposed between the lower electrode 6 and the upper electrode 8, a protective layer 9 formed on the upper electrode 8, and a color filter 10 formed on the protective layer 9.

The lower electrodes 6 are made of aluminum, titanium nitride, or the like and are opaque to incident light. The lower electrodes 6 are separated from each other so as to correspond to the respective pixel portions. The centers of the color filters 10 coincide with those of the lower electrodes 6 in a plan view.

The photoelectric conversion layer 7 is made of a photoelectric conversion material that absorbs visible light and generates signal charges corresponding to the amount of absorbed light. The photoelectric conversion material can be a known organic or inorganic material. Although in the embodiment the photoelectric conversion layer 7 is a single layer that is common to all the pixel portions, separate photoelectric conversion layers may be provided so as to correspond to the respective pixel portions.

The upper electrode 8 is made of ITO or the like and is transparent to incident light, and is a single electrode that is common to all the pixel portions. Alternatively, separate upper electrodes may be provided so as to correspond to the respective pixel portions. A prescribed bias voltage can be applied to the upper electrode 8 so that an electric field develops across the photoelectric conversion layer 7.

The protective layer 9, which serves to protect the photoelectric conversion portions, is made of, for example, an insulative material that is transparent to incident light. Where the protective layer 9 is made of an organic material, consideration should be given to the fact that organic materials are not suitable for photolithography because in general their characteristics are degraded to a large extent when they are exposed to water or a solvent. Since photolithography is generally used in forming the color filters 10, the characteristics of the photoelectric conversion layer 7 would be degraded if the protective layer 9 were not be used. In view of the above, in the solid-state imaging device of FIG. 1A, the protective layer 9 is provided between the photoelectric conversion layer 7 and the color filters 10. The protective layer 9 may be an alumina layer, a nitride layer, or the like.

The color filters 10 include three kinds of color filters, that is, R color filters which transmit light in the red (R) wavelength range, G color filters which transmit light in the green (G) wavelength range, and B color filters which transmit light in the blue (B) wavelength range. The large number of pixel portions are composed of pixel portions each having an R color filter, pixel portions each having a G color filter, and pixel portions each having a B color filter, and are arranged in a prescribed pattern so as to be able to generate a color image.

Charge storage portions 2, which are high-concentration n-type impurity layers, are formed in the p-type silicon substrate 1 so as to correspond to the respective pixel portions. Each charge storage portion 2, which serves to store signal charges generated in that portion of the photoelectric conversion layer which corresponds to the associated pixel portion, is electrically connected to the lower electrode 6 of the associated pixel portion via a plug 5 which is made of a conductive material such as tungsten.

Signal readout circuits 4 are also formed in the p-type silicon substrate 1 so as to correspond to the respective charge storage portions 2. The signal readout circuits 4, each of which serves to output a voltage signal corresponding to the signal charge stored in the associated charge storage portion 2, may be, for example, circuits using CMOS circuits or a CCD and an amplifier.

Figure 1B:
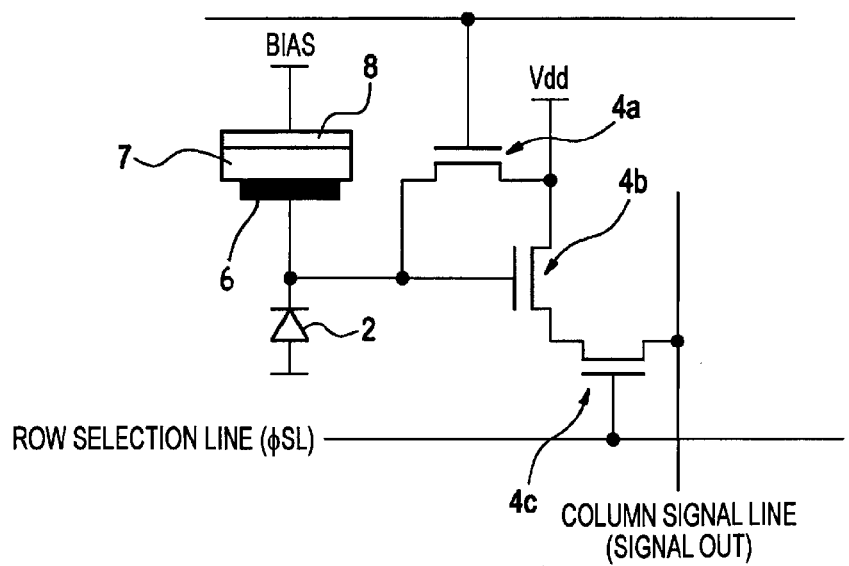

FIG. 1B shows an example configuration of each signal readout circuit 4 shown in FIG. 1A.

As shown in FIG. 1B, each signal readout circuit 4 has a known 3-transistor configuration including a reset transistor 4a for resetting the signal charge stored in the charge storage portion 2, an output transistor 4b for converting the signal charge stored in the charge storage portion 2 into a voltage signal, and a selection transistor 4c for outputting the output voltage signal of the output transistor 4b to a column signal line. A gate oxide layer of the transistors 4a, 4b, and 4c is formed on the p-type silicon substrate 1. The gate oxide layer 3 is made of silicon oxide, for example.

The solid-state imaging device of FIG. 1A is provided with partitions 11 for preventing a phenomenon that light incident on the color filter 10 of an arbitrary pixel portion enters adjacent pixel portions. The partitions 11 are provided between the color filters of the adjoining pixel portions so as to cover the side surfaces of the color filters 10.

It suffices that the partitions 11 constitute regions that absorb or reflect incident light. And the partitions 11 may be made of a material that absorb or reflect incident light (e.g., a metal such as tungsten or aluminum or a black dye or pigment) or may be air layers which reflect incident light totally. To reflect incident light totally, each air layer should satisfy a condition $\sin(90°-\alpha) > 1/n$ where $\alpha$ is the angle of incidence of the incident light on the color filter 10 of a pixel portion and n is the refractive index of the air layer. For example, where n=1.5, the condition is satisfied when $\alpha$ is smaller than 48.2°. This means that almost all of oblique light can be reflected totally.

A sealing glass 12 for sealing the entire solid-state imaging device is provided on the color filters 10 and the partitions 11.

The operation of the above-configured solid-state imaging device will be described below.

R light of incident light passes through the R color filter 10 and enters that portion of the photoelectric conversion layer 7 which is located right under the R color filter 10, whereby signal charges are generated there according to the amount of the R light. G light of the incident light passes through the G color filter 10 and enters that portion of the photoelectric conversion layer 7 which is located right under the G color filter 10, whereby signal charges are generated there according to the amount of the G light. B light of the incident light passes through the G color filter 10 and enters that portion of the photoelectric conversion layer 7 which is located right under the B color filter 10, whereby signal charges are generated there according to the amount of the B light. Part of light that is incident on each color filter 10 obliquely is absorbed or reflected by the partition 11 covering the side surfaces of the color filter 10, whereby the amount of light that reaches the adjacent pixel portions is reduced.

The signal charges generated in each portion of the photoelectric conversion layer 7 are collected by the lower electrode 6 because of the electric field developing there, moved to the charge storage portion 2 via the plug 5, and stored in the charge storage portion 2. The signal charges stored in the charge storage portions 2 are read out sequentially to the column signal line as voltage signals by the signal readout circuits 4. Color image data can be generated by performing prescribed signal processing on the voltage signals that are output from the solid-state imaging device.

As described above, by virtue of the partitions 11 provided between the color filters 10, the solid-state imaging device of FIG. 1A can reduce the probability that light incident on the color filter 10 of an arbitrary pixel portion enters the pixel portions adjacent to it. This suppresses color contamination and hence makes it possible to realize a solid-state imaging device capable of high-image-quality imaging. Where the size of each pixel portion is less than 2 μm, the length from the bottom surface of the photoelectric conversion layer 7 to the top surfaces of the color filters 10 is comparable to the size of each pixel portion and the probability of leakage of oblique incident light into adjacent pixel portions is increased. Reducing the probability of leakage of oblique incident light into adjacent pixel portions by providing the partitions 11 makes it possible to maintain the image quality even in the case where the degree of miniaturization is increased.

The partitions 11 can be formed by forming R color filters, G color filters, and B color filters in order on the protective layer 9, forming openings at the boundary portions between the color filters 10, and forming a sealing glass 12 after filling the openings with a light reflecting or absorbing material or with the openings left as they are. Alternatively, the partitions 11 may be formed on the protective layer 9 with a light reflecting or absorbing material, followed by filling the spaces surrounded by the partitions 11 with color filters 10. These manufacturing methods can prevent the color filters 10 of the different colors from overlapping with each other at the boundary portions, and hence can prevent color contamination more reliably. Where the partitions 11 are air layers, the manufacturing process can be simplified, resulting in a reduction in manufacturing cost.

In the solid-state imaging device of FIG. 1A, it has been found that the color contamination can be suppressed to such a level as to cause no problems in practice if the thickness of the protective layer is in the range of 0 to 1.0 μm. It has also been found that the efficiency of light utilization can be kept at such a level as to cause no problems in practice if the width of each partition 11 as measured parallel with the surfaces of the color filters 10 is in the range of 0.05 μm to 0.2 times the size of each pixel portion and the sum of the thickness of the color filters 10 and the thickness of the protective layer 9 is in the range of 0.2 to 1.4 μm.

Figure 2:
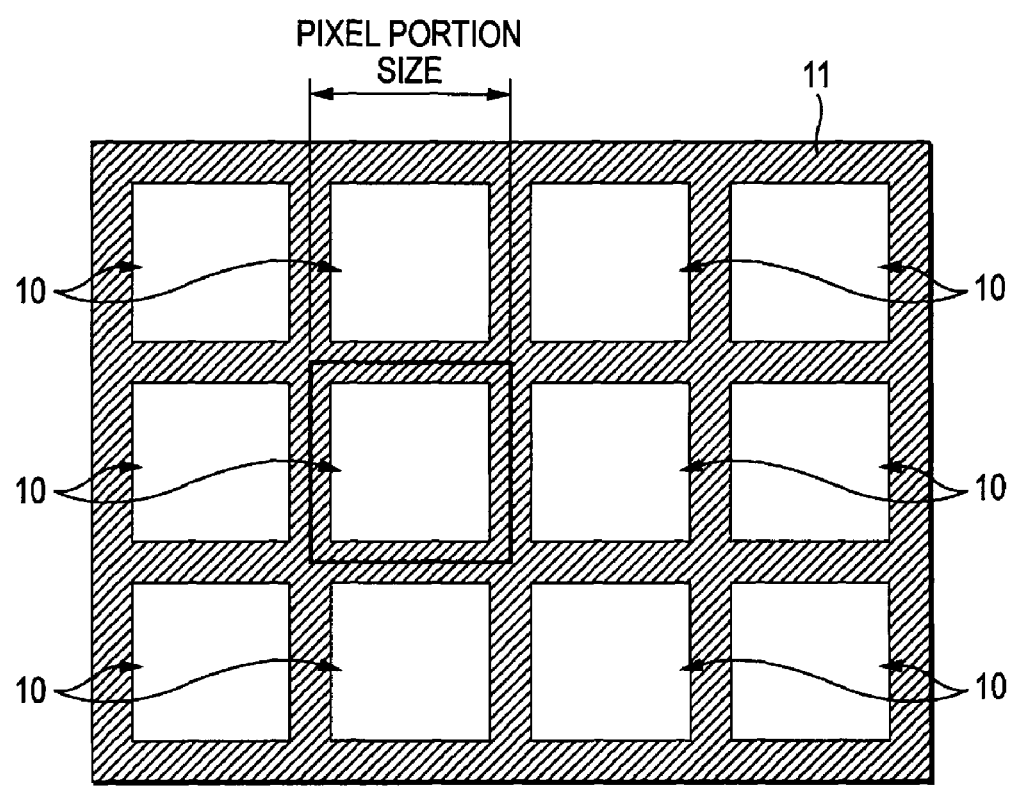
FIG. 2 shows a definition of the size of each pixel portion.

As shown in FIG. 2, where each color filter 10 is square, the size of each pixel portion is defined as the sum of ½ of the width of each partition 11 between the adjoining color filters 10, the length of one sideline of each color filter 10, and ½ of the width of each partition 11 between the adjoining color filters 10. The grounds of the above-mentioned numerical values will be described below using simulation results.

Figure 3:
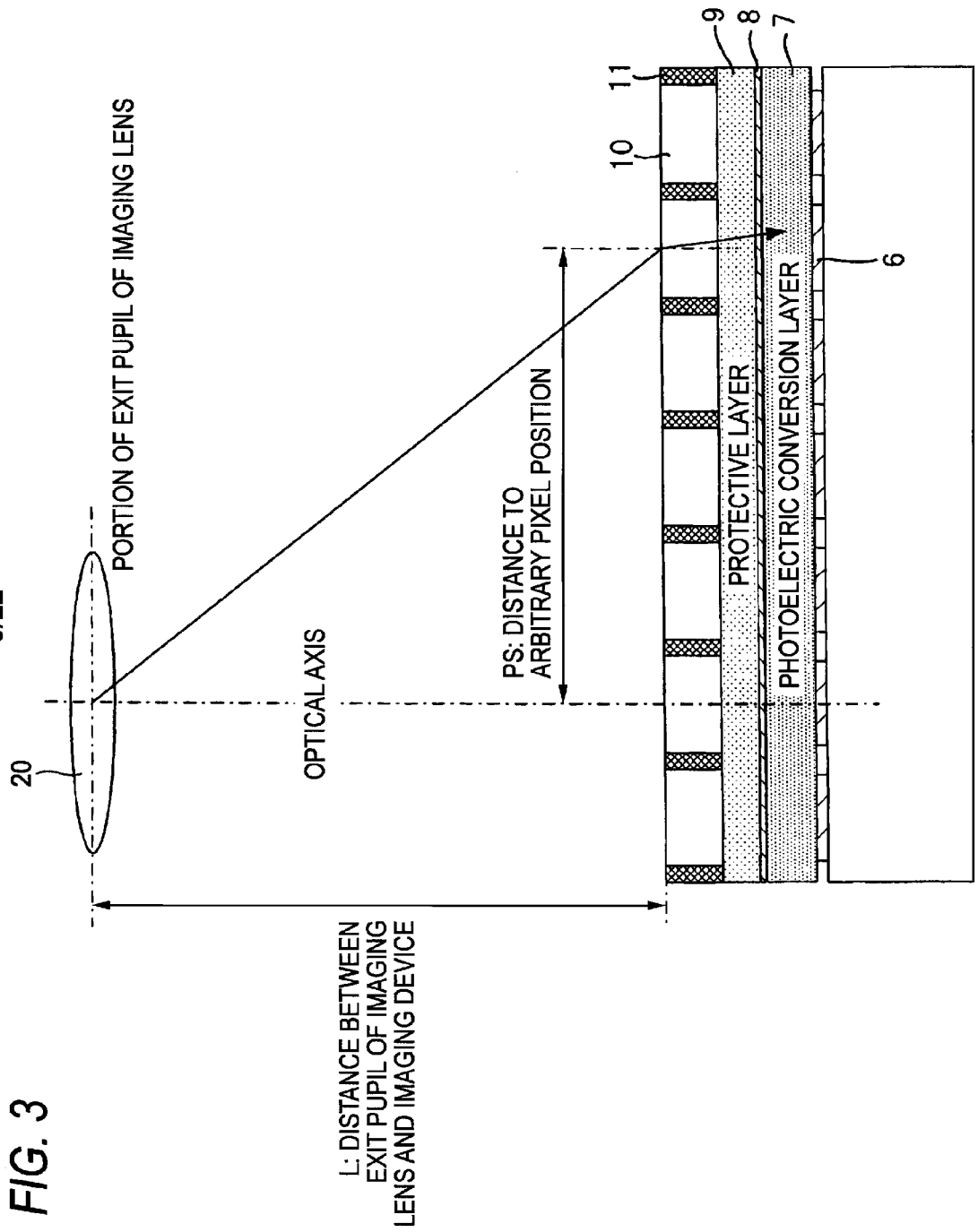
FIG. 3 shows the configuration of a simulated imaging apparatus.

FIG. 3 shows the configuration of a simulated imaging apparatus. The imaging apparatus of FIG. 3 is provided with the solid-state imaging device of FIGS. 1A and 1B and an imaging lens 20. In simulations, the sealing glass 12 of the solid-state imaging device was omitted.

Figure 4:
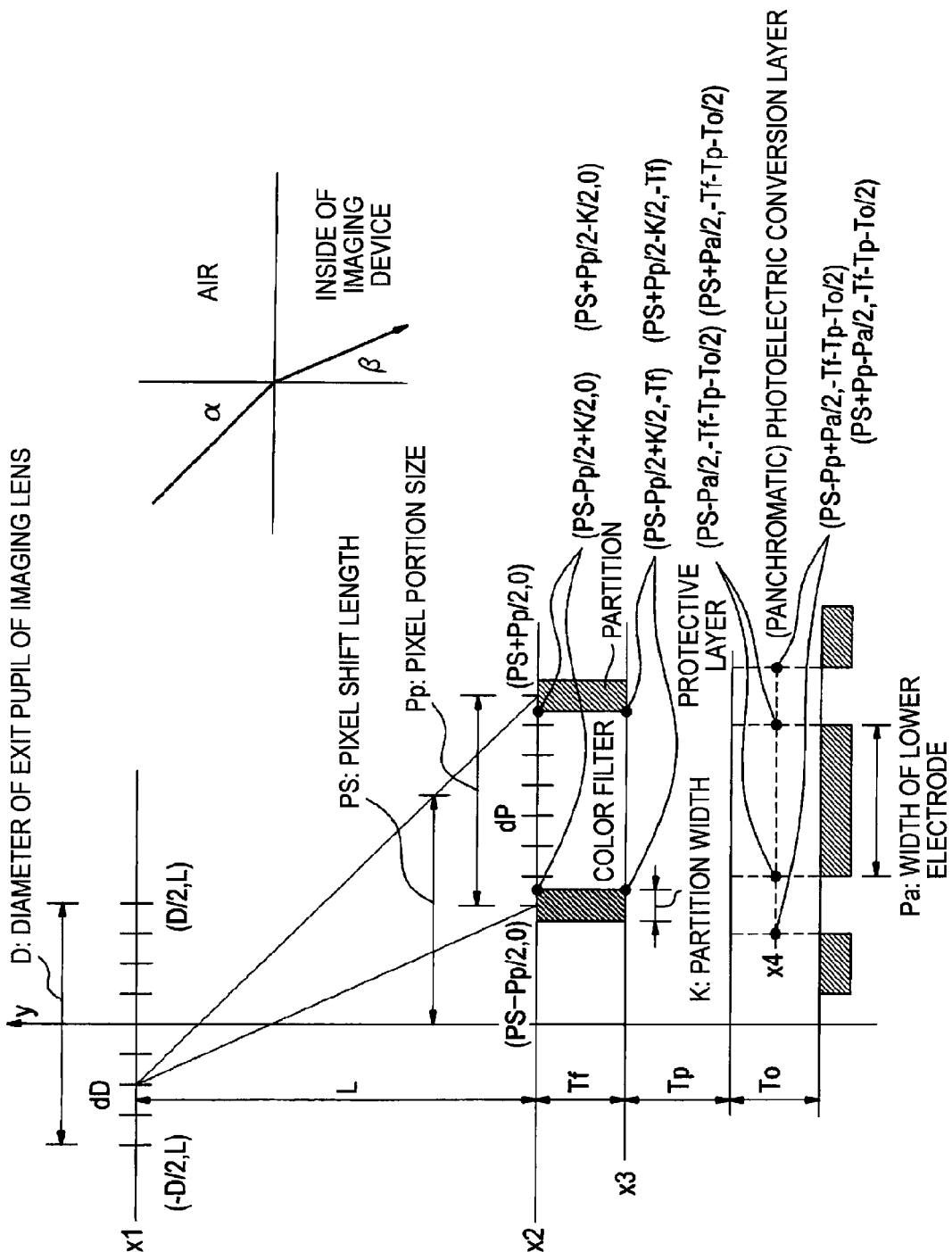
FIG. 4 shows how the X and Y coordinate axes are set in the imaging apparatus of FIG. 3.

FIG. 4 shows how the X and Y coordinate axes are set in the imaging apparatus of FIG. 3. The optical axis of the imaging lens 20 is employed as the Y axis and a direction that is perpendicular to the optical axis of the imaging lens 20 in the plane including the top surfaces of the color filters 10 is employed as the X axis. It is assumed that the center (located on the optical axis) of the exit pupil of the imaging lens 20 has coordinates (0, L), the position, located on the optical axis, in the top surface of the protective layer 9 has coordinates (0, −Tf), and the position, located on the optical axis, in the center plane (in the Y-axis direction) of the photoelectric conversion layer 7 has coordinates (0, −Tf−Tp−To/2).

It is assumed that 100% of a light beam entering the photoelectric conversion layer 7 is photoelectrically converted at a position in the center plane (in the Y-axis direction) of the photoelectric conversion layer 7, the position being located in the portion of the photoelectric conversion layer 7 that is sandwiched between the upper electrode 8 and a lower electrode 6. Furthermore, the upper electrode 8 is disregarded in the simulations because it is as very thin as several nanometers.

The diameter of the exit pupil of the imaging lens 20 in the X-axis direction is represented by D. The distance (pixel shift length) from the optical axis of the imaging lens 20, that is, the center axis of the solid-state imaging device, to the center of an arbitrary pixel portion is represented by PS. The size of each pixel portion is represented by Pp. The width of each partition 11 in the X-axis direction is represented by K. The width of each lower electrode 6 in the X-axis direction is represented by Pa. It is assumed that an arbitrary point in the exit pupil plane of the imaging lens 20 has coordinates $(x_1, L)$, an arbitrary point in the plane including the top surfaces of the color filters 10 has coordinates $(x_2, 0)$, an arbitrary point in the top surface of the protective layer 9 has coordinates $(x_3, -Tf)$, and an arbitrary point in the center plane (in the Y-axis direction) of the photoelectric conversion layer 7 has coordinates $(x_4, -Tf-Tp-To/2)$.

With the above setting, the left end and the right end of the exit pupil of the imaging lens 20 are given coordinates (−D/2, L) and (D/2, L), respectively. The left end and the right end of the top surface an arbitrary pixel portion are given coordinates (PS−Pp/2, 0) and (PS+Pp/2, 0), respectively.

The left end and the right end of the top surface of the color filter 10 of an arbitrary pixel portion are given coordinates (PS−Pp/2+K/2, 0) and (PS+Pp/2−K/2, 0), respectively. The left end and the right end of the bottom surface of the color filter 10 of an arbitrary pixel portion are given coordinates (PS−Pp/2+K/2, −Tf) and (PS+Pp/2−K/2, −Tf), respectively.

The point, right above the left end of the lower electrode 6 of an arbitrary pixel portion, in the center plane of the photoelectric conversion layer 7 is given by (PS−Pa/2, −Tf−Tp−To/2). The point, right above the right end of the lower electrode 6 of an arbitrary pixel portion, in the center plane of the photoelectric conversion layer 7 is given by (PS+Pa/2, −Tf−Tp−To/2).

The refractive index of the color filters 10, the protective layer 9, the upper electrode 8, and the photoelectric conversion layer 7 is represented by n. The incident angle and the refraction angle of a light ray entering a color filter 10 concerned are represented by α and β, respectively.

The procedure of a ray-trace simulation that was performed with the above setting will be described below.

1) Assume that a light ray that originates from point A $(x_1, L)$ in the exit pupil plane of the imaging lens 20 is incident on the top surface of a pixel portion (i.e., the top surface of its color filter 10) at point B $(x_2, 0)$. The straight line passing through points A and B is represented by the following Equation (1):

$$y - y_2 = \frac{y_1 - y_2}{x_1 - x_2}(x - x_2) \quad (1)$$

Substituting $y_1=L$ and $y_2=0$ into Equation (1), we obtain the following Equation (2) which represents a straight line:

$$y = \frac{L}{x_1 - x_2}(x - x_2) \quad (2)$$

2) Since the light ray incident on the top surface of the pixel portion at point B $(x_2, 0)$ is refracted by the top surface of the pixel portion, an equation representing a straight line to be traced by a refracted light ray (post-refraction straight line) will be calculated.

Equations $$\tan\alpha = \frac{x_1 - x_2}{L}, \sin\alpha = n\sin\beta, \text{ and } \tan^2\beta = \frac{\sin^2\beta}{1 - \sin^2\beta}$$

hold.

An equation representing a post-refraction straight line that passes through point B $(x_2, 0)$ and has a slope $1/\tan\beta$ is given by the following Equation (3):

$$y = \frac{1}{\tan\beta}(x - x_2) \quad (3)$$

By substituting $x=x_3$ and $y=-Tf$ into Equation (3), the X coordinate of the intersection of the post-refraction straight line and the top surface ($x_3$ surface) of the protective layer 9 is calculated as $$x_3 = -Tf\tan\beta + x_2.$$

By substituting $x=x_4$ and $y=-Tf-Tp-To/2$ into Equation (3), the X coordinate of the intersection of the post-refraction straight line and the center plane ($x_4$ plane) of the photoelectric conversion layer 7 is calculated as $$x_4 = -(Tf+Tp+To/2)\tan\beta + x_2.$$

3) N light rays are assumed that originate from the left end $(-D/2, L)$ of the exit pupil of the imaging lens 20 and reach points that are located in the top surface of the color filter 10 and arranged at a pitch dP from the left end (PS−Pp/2, 0) to the right end (PS+Pp/2, 0) of the pixel portion having the pixel shift length PS. And the numbers of post-refraction light rays whose intersections with the $x_2$ surface, $x_3$ surface, and $x_4$ surface are located in the range of (PS−Pp/2+K/2, 0) to (PS+Pp/2−K/2, 0), the range of (PS−Pp/2+K/2, −Tf) to (PS+Pp/2−K/2, −Tf), and the range of (PS−Pa/2, −Tf−Tp−To/2) to (PS+Pa/2, −Tf−Tp−To/2), respectively, are counted.

4) The above calculation is repeated while the light ray exit point is moved at a pitch dD from the left end to the right end of the exit pupil of the imaging lens 20.

5) The total number of light rays is represented by TN, and the angle of incidence, on the top surface of the color filter 10, of a light ray that originates from the center (0, L) of the exit pupil of the imaging lens 20 and reaches the center (PS, 0) of the top surface of the color filter 10 is represented by θ (tan θ=PS/L). The number of light rays that reach, at the incident angle θ, the center plane of that portion of the photoelectric conversion layer 7 which is located right above the lower electrode 6 of the pixel portion including the color filter 10 concerned is represented by P1(θ), and the number of light rays that reach, at the incident angle θ, the center planes of those portions of the photoelectric conversion layer 7 which are located right above the lower electrodes 6 of the pixel portions adjacent to the above pixel portion is represented by Pc(θ). The two-dimensional efficiency of light utilization Q1(θ) and the two-dimensional color contamination ratio Qc(θ) are given by $$Q1(\theta)=P1(\theta)/TN$$

$$Qc(\theta)=Pc(\theta)/TN.$$

6) The above calculation is repeated while the pixel shift length PS in the plane including the top surfaces of the color filters 10 is increased (i.e., θ is increased).

(7) The three-dimensional efficiency of light utilization S1(θ) and the three-dimensional color contamination ratio Sc(θ) are approximated by using the efficiency of light utilization Q1(θ) obtained when the incident angle θ is 0° (PS=0). This corresponds to a case that the shape of the lens exit pupil is approximated by a rectangle.

$$S1(\theta)=Q1(\theta)\cdot Q1(0)$$

$$Sc(\theta)=Qc(\theta)\cdot Q1(0)$$

Where the solid-state imaging device is used in a digital camera, a video camera, a portable module, or the like, it is important that how the imaging characteristics vary when the aperture of the imaging lens 20 is varied (f-number dependence) and how the imaging characteristics depend on the position (center/peripheral) in an image taken, that is, how the imaging characteristics vary when the angle of incidence, on the solid-state imaging device, of the light ray that originates from the exit pupil of the imaging lens 20 (incident angle dependence) is varied, be within allowable ranges. In view of this, consideration was given to the f-number dependence and the incident angle dependence of the imaging characteristics using the pixel portion size Pp, the thickness Tf of the color filters 10, and the thickness Tp of the protective layer 9 as parameters. Results are as follows.

A) Differences in Characteristics Between the Case with Partitions 11 and the Case Without Partitions 11

FIGS. 5-12 show simulation results of the f-number dependence and the incident angle dependence of the case with the partitions 11 and without the partitions 11 in which the pixel portion size Pp was set at 2 μm, the thickness Tf of the color filters 10 was set at 1 μm, and the thickness Tp of the protective layer 9 was varied. "Without the partitions 11" means that the value of the parameter K is equal to 0.

Figure 5:
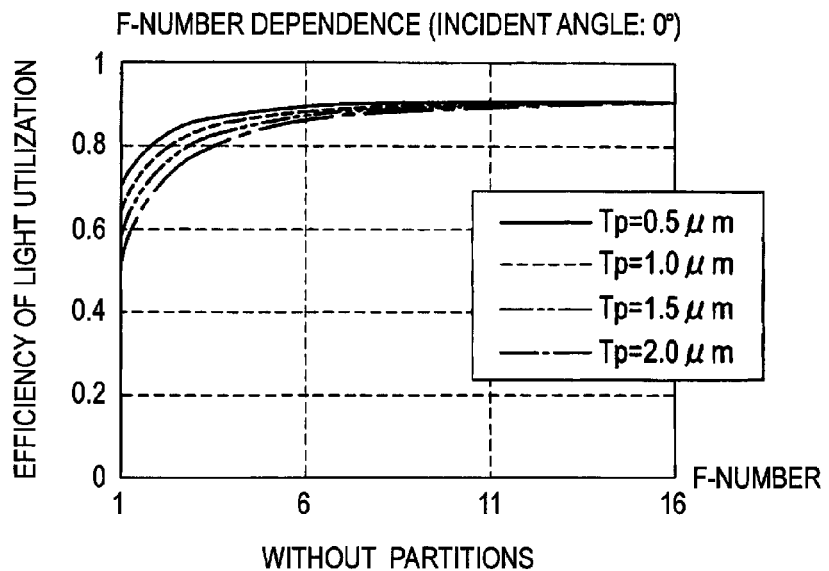
FIG. 5 is a graph showing a simulation result of the f-number dependence of the efficiency of light utilization in the case that partitions are not used in the configuration of FIG. 3.
Figure 6:
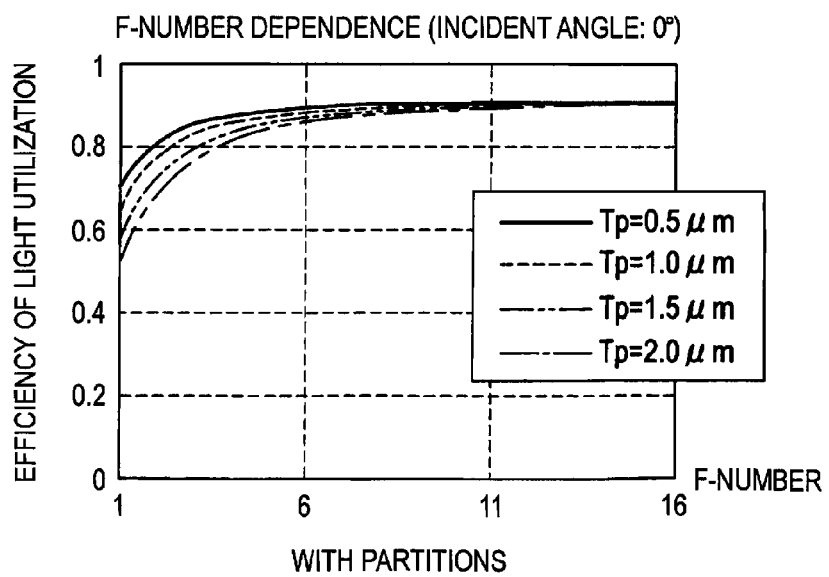
FIG. 6 is a graph showing a simulation result of the f-number dependence of the efficiency of light utilization in the case that the partitions are used in the configuration of FIG. 3.
Figure 7:
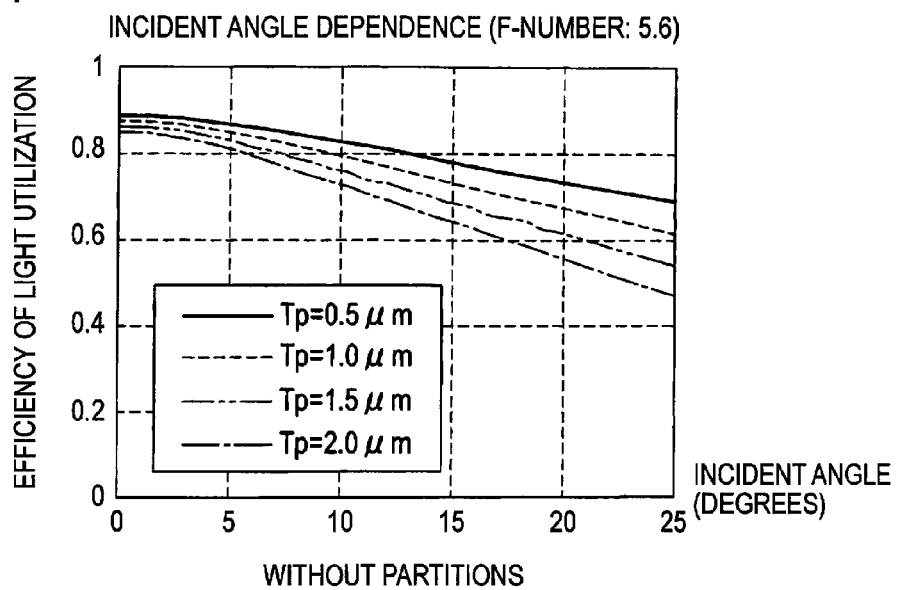
FIG. 7 is a graph showing a simulation result of the incident angle dependence of the efficiency of light utilization in the case that the partitions are not used in the configuration of FIG. 3.
Figure 8:
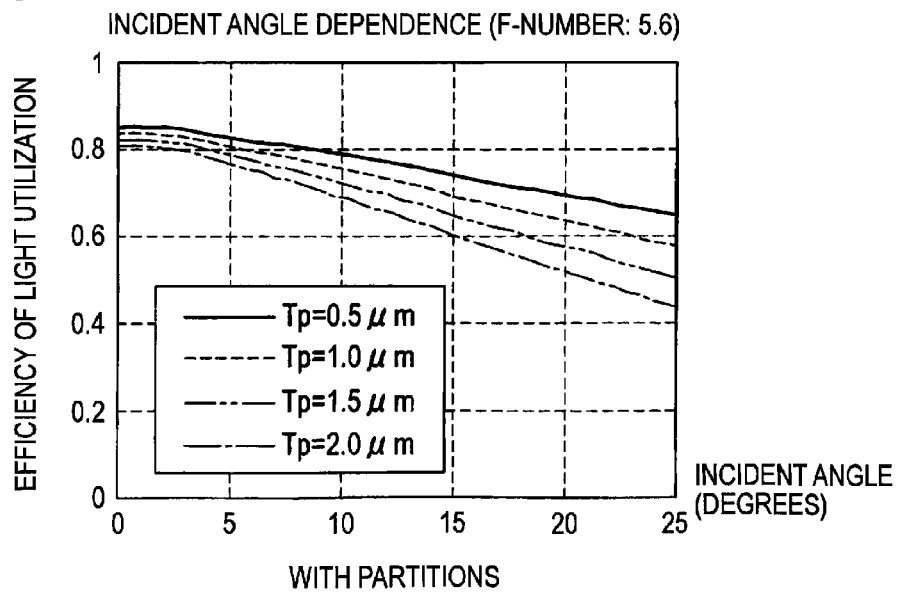
FIG. 8 is a graph showing a simulation result of the incident angle dependence of the efficiency of light utilization in the case that the partitions are used in the configuration of FIG. 3.

FIG. 5 is a graph showing a simulation result of the f-number dependence of the efficiency of light utilization in the case that the partitions 11 are not used in the configuration of FIG. 3. FIG. 6 is a graph showing a simulation result of the f-number dependence of the efficiency of light utilization in the case that the partitions 11 are used in the configuration of FIG. 3. FIG. 7 is a graph showing a simulation result of the incident angle dependence of the efficiency of light utilization in the case that the partitions 11 are not used in the configuration of FIG. 3. FIG. 8 is a graph showing a simulation result of the incident angle dependence of the efficiency of light utilization in the case that the partitions 11 are used in the configuration of FIG. 3.

Figure 9:
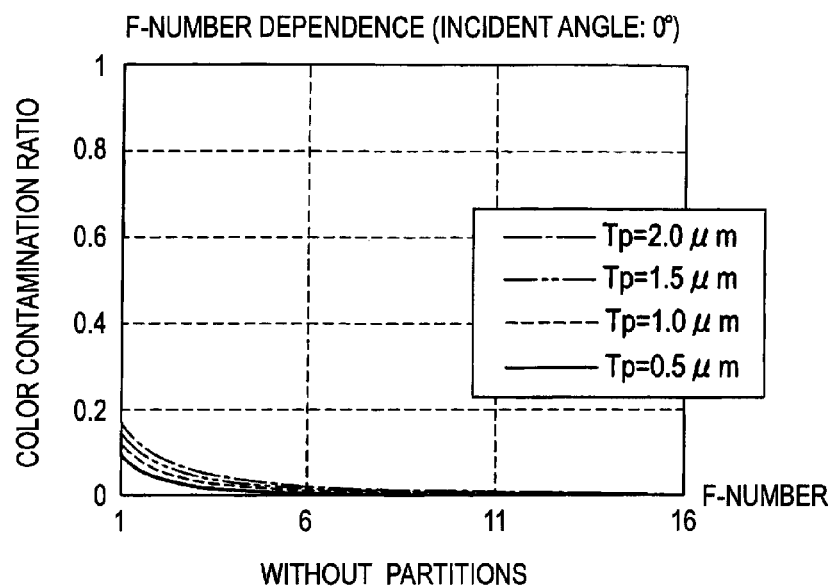
FIG. 9 is a graph showing a simulation result of the f-number dependence of the color contamination ratio in the case that the partitions are not used in the configuration of FIG. 3.
Figure 10:
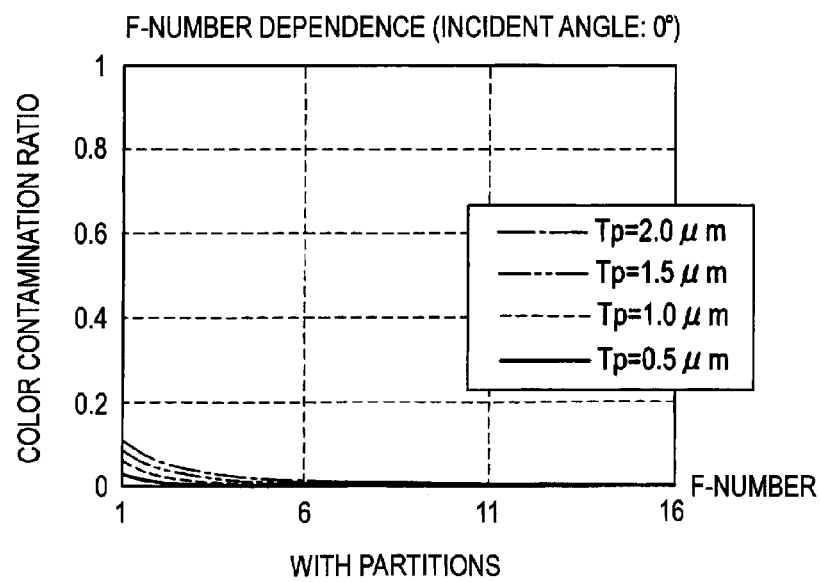
FIG. 10 is a graph showing a simulation result of the f-number dependence of the color contamination ratio in the case that the partitions are used in the configuration of FIG. 3.
Figure 11:
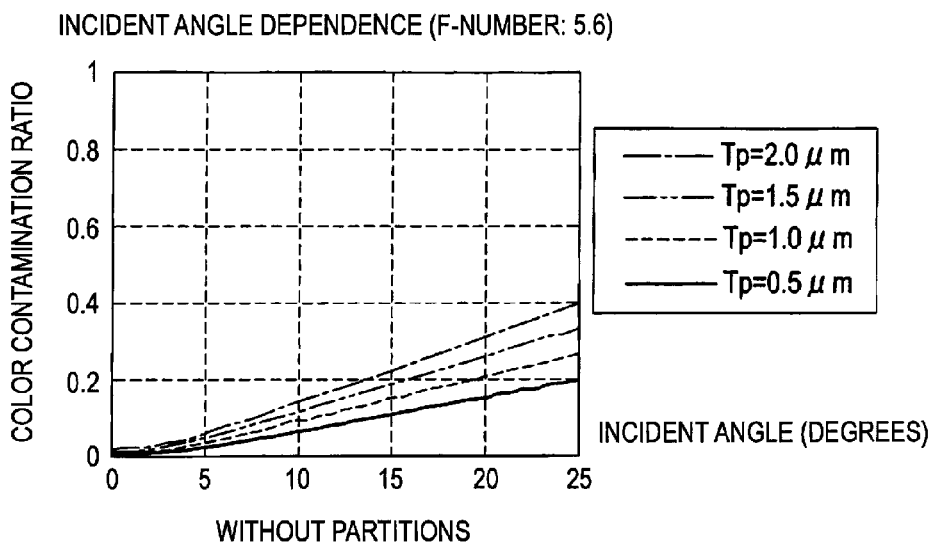
FIG. 11 is a graph showing a simulation result of the incident angle dependence of the color contamination ratio in the case that the partitions are not used in the configuration of FIG. 3.
Figure 12:
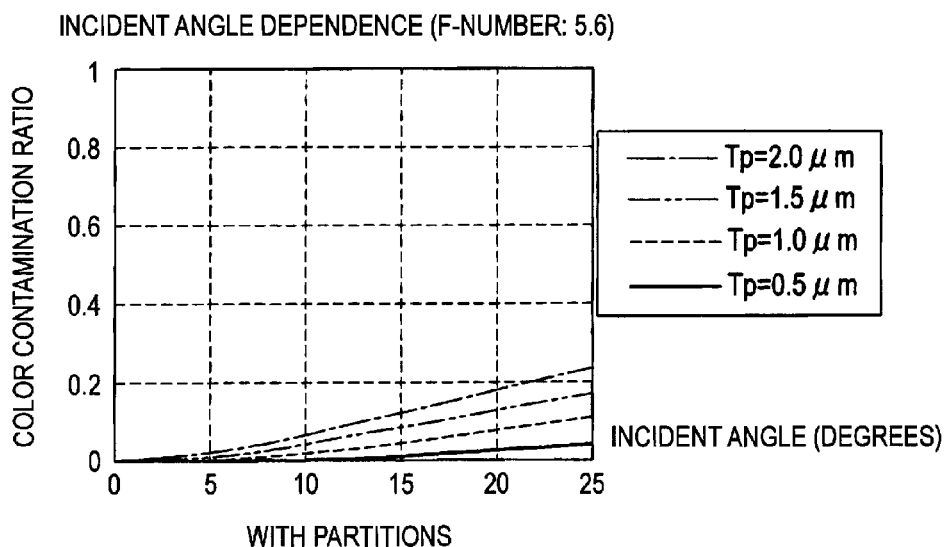
FIG. 12 is a graph showing a simulation result of the incident angle dependence of the color contamination ratio in the case that the partitions are used in the configuration of FIG. 3.

FIG. 9 is a graph showing a simulation result of the f-number dependence of the color contamination ratio in the case that the partitions 11 are not used in the configuration of FIG. 3. FIG. 10 is a graph showing a simulation result of the f-number dependence of the color contamination ratio in the case that the partitions 11 are used in the configuration of FIG. 3. FIG. 11 is a graph showing a simulation result of the incident angle dependence of the color contamination ratio in the case that the partitions 11 are not used in the configuration of FIG. 3. FIG. 12 is a graph showing a simulation result of the incident angle dependence of the color contamination ratio in the case that the partitions 11 are used in the configuration of FIG. 3.

The following are seen from those results:

The use of the partitions 11 reduces the color contamination ratio greatly though it does not change the efficiency of light utilization much.

The color contamination ratio depends on the thickness Tp of the protective layer 9.

Conditions for a low color contamination ratio corresponding to an arbitrary combination of the f-number and the incident angle are effective for all combinations of the f-number and the incident angle.

Consideration was also given to the relationships between the efficiency of light utilization/color contamination ratio and the thickness Tf of the color filters 10, the thickness Tp of the protective layer 9, and the pixel portion size Pp in a case that the partitions 11 were used, the f-number was 5.6, and the incident angle was 25°. Results are as follows.

Figure 13:
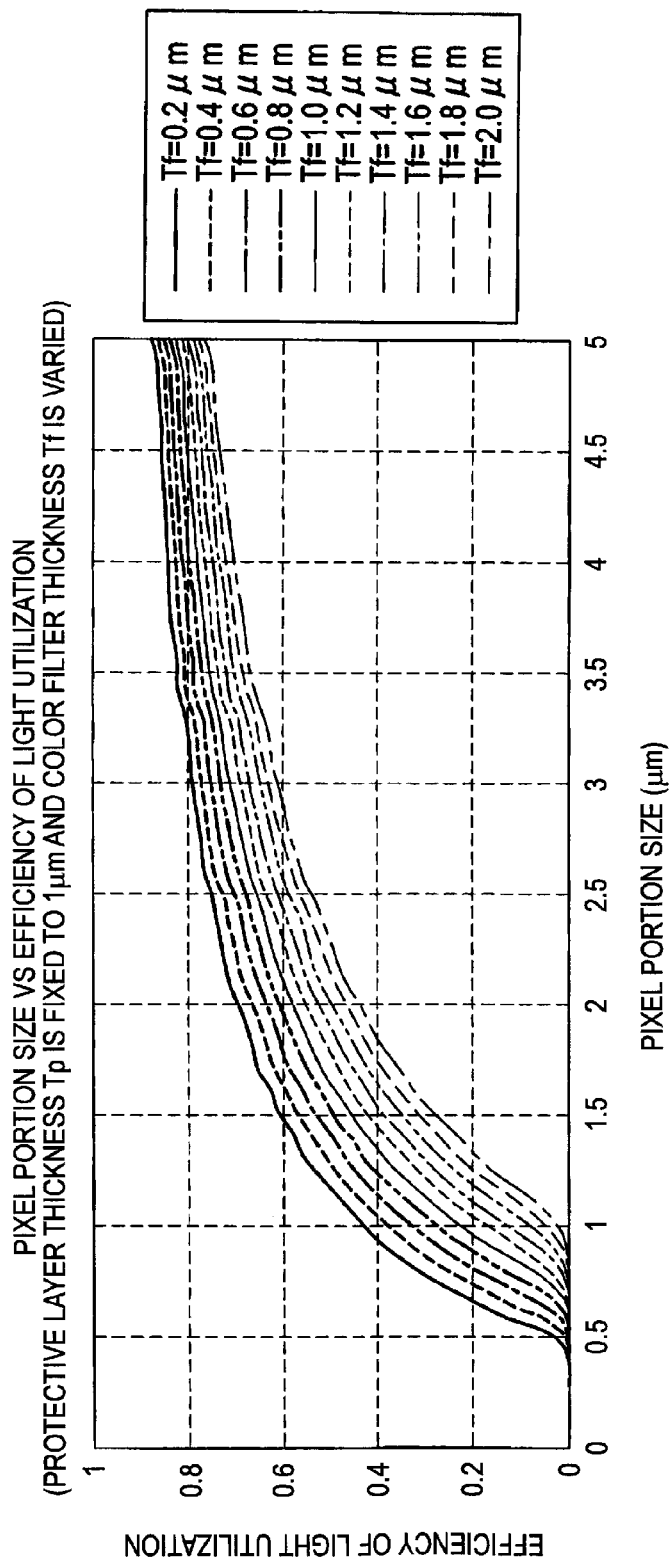
FIG. 13 is a graph showing a simulation result of the efficiency of light utilization in a case that the thickness Tp of a protective layer is fixed to 1 μm and the thickness Tf of color filters is varied in the configuration of FIG. 3.
Figure 14:
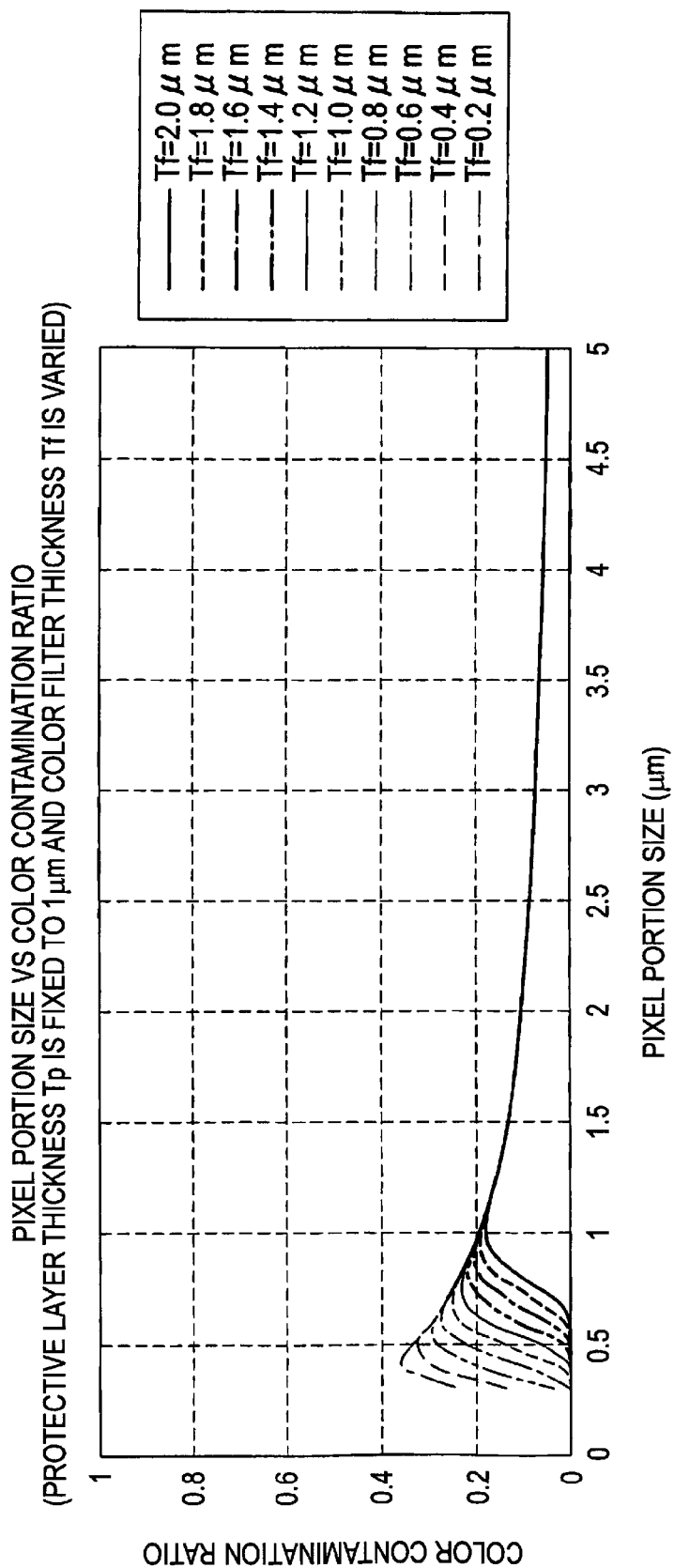
FIG. 14 is a graph showing a simulation result of the color contamination ratio in the case that the thickness Tp of the protective layer is fixed to 1 μm and the thickness Tf of the color filters is varied in the configuration of FIG. 3.

B) Relationships Between the Efficiency of Light Utilization/Color Contamination Ratio and the Thickness Tf of the Color Filters 10, the Thickness Tp of the Protective Layer 9, and the Pixel Portion Size Pp (a) Case that the Thickness Tp of the Protective Layer 9 is Fixed to 1 μm and the Thickness Tf of the Color Filters 10 is Varied FIG. 13 is a graph showing a simulation result of the efficiency of light utilization in a case that the thickness Tp of the protective layer 9 is fixed to 1 μm and the thickness Tf of the color filters 10 is varied in the configuration of FIG. 3. FIG. 14 is a graph showing a simulation result of the color contamination ratio in the case that the thickness Tp of the protective layer 9 is fixed to 1 μm and the thickness Tf of the color filters 10 is varied in the configuration of FIG. 3.

Figure 15:
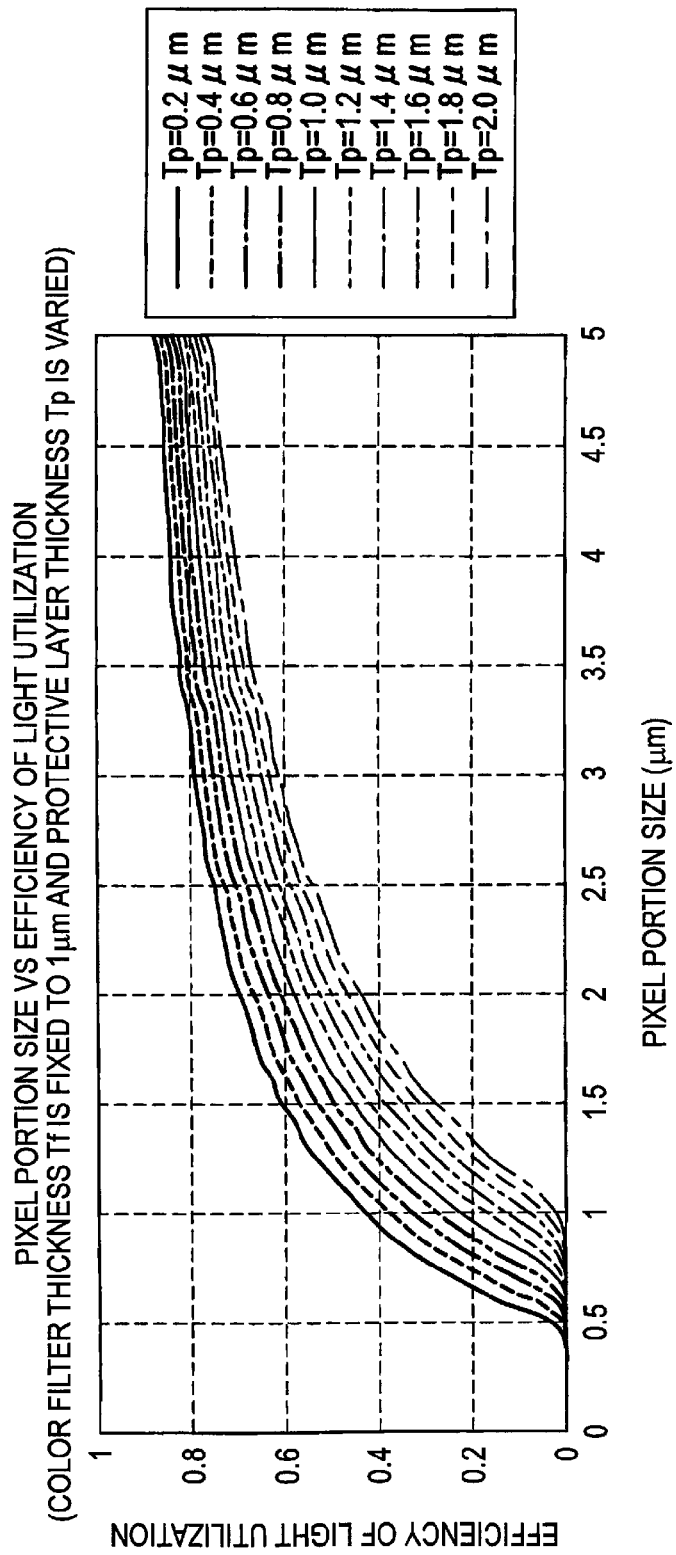
FIG. 15 is a graph showing a simulation result of the efficiency of light utilization in a case that the thickness Tf of the color filters is fixed to 1 μm and the thickness Tp of the protective layer is varied in the configuration of FIG. 3.
Figure 16:
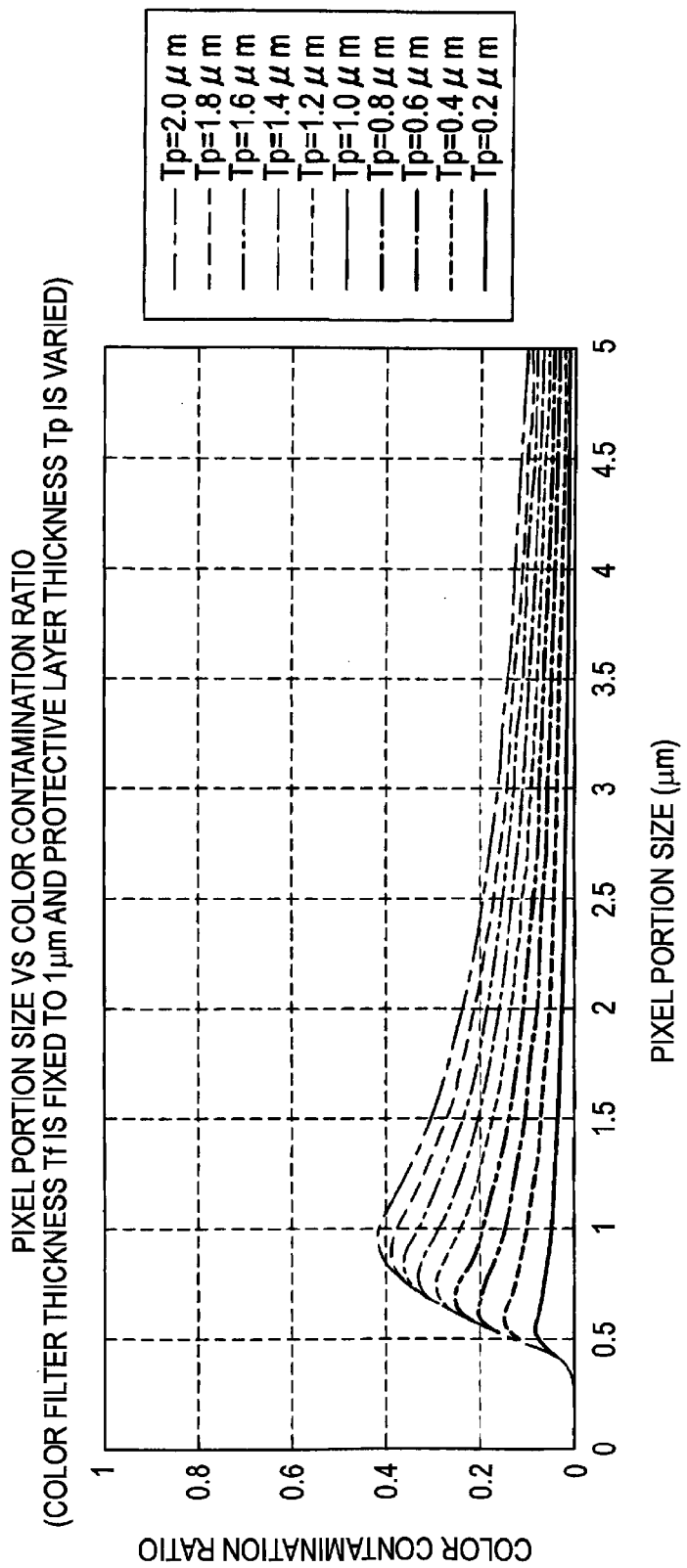
FIG. 16 is a graph showing a simulation result of the color contamination ratio in the case that the thickness Tf of the color filters is fixed to 1 μm and the thickness Tp of the protective layer is varied in the configuration of FIG. 3.

(b) Case that the Thickness Tf of the Color Filters 10 is Fixed to 1 μm and the Thickness Tp of the Protective Layer 9 is Varied FIG. 15 is a graph showing a simulation result of the efficiency of light utilization in a case that the thickness Tf of the color filters 10 is fixed to 1 μm and the thickness Tp of the protective layer 9 is varied in the configuration of FIG. 3. FIG. 16 is a graph showing a simulation result of the color contamination ratio in the case that the thickness Tf of the color filters 10 is fixed to 1 μm and the thickness Tp of the protective layer 9 is varied in the configuration of FIG. 3.

Figure 17:
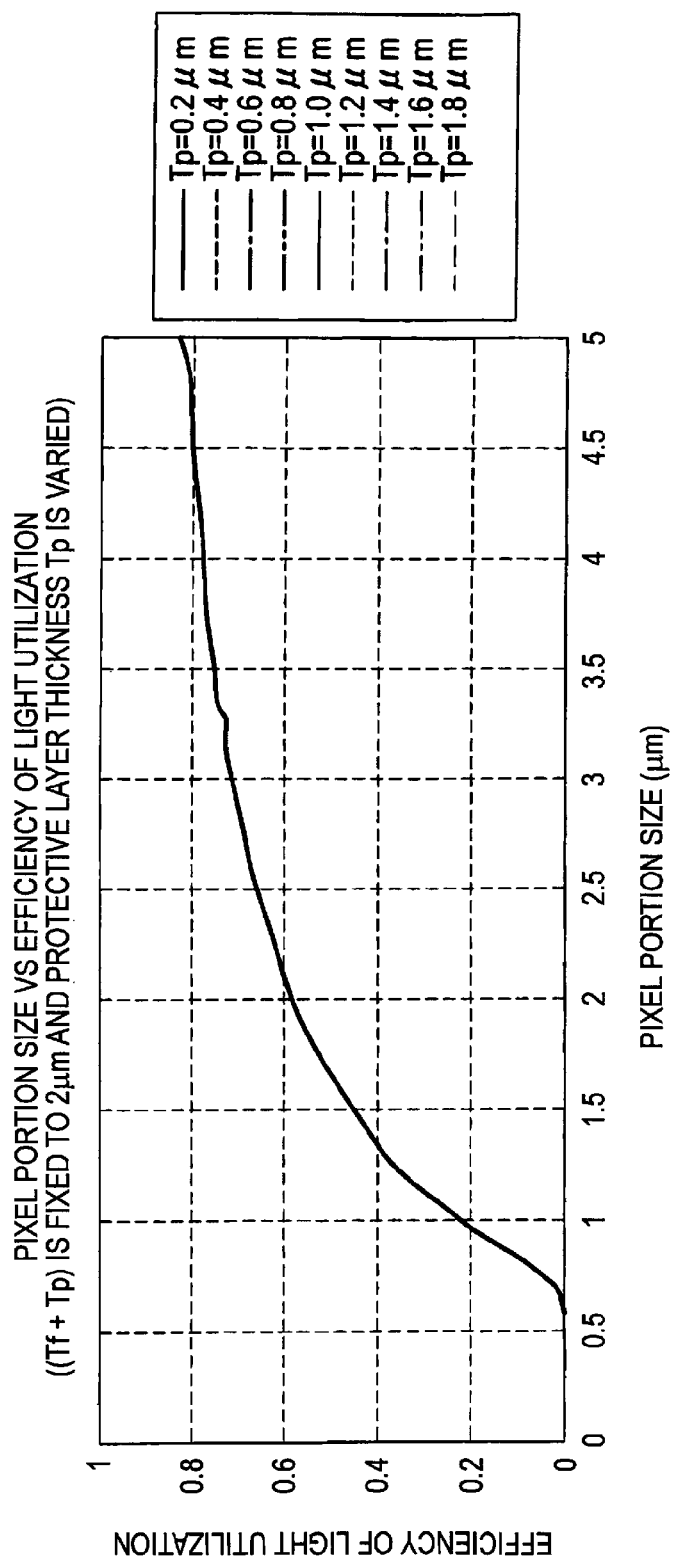
FIG. 17 is a graph showing a simulation result of the efficiency of light utilization in a case that Tf+Tp is fixed to 2 μm and the thickness Tp of the protective layer is varied in the configuration of FIG. 3.
Figure 18:
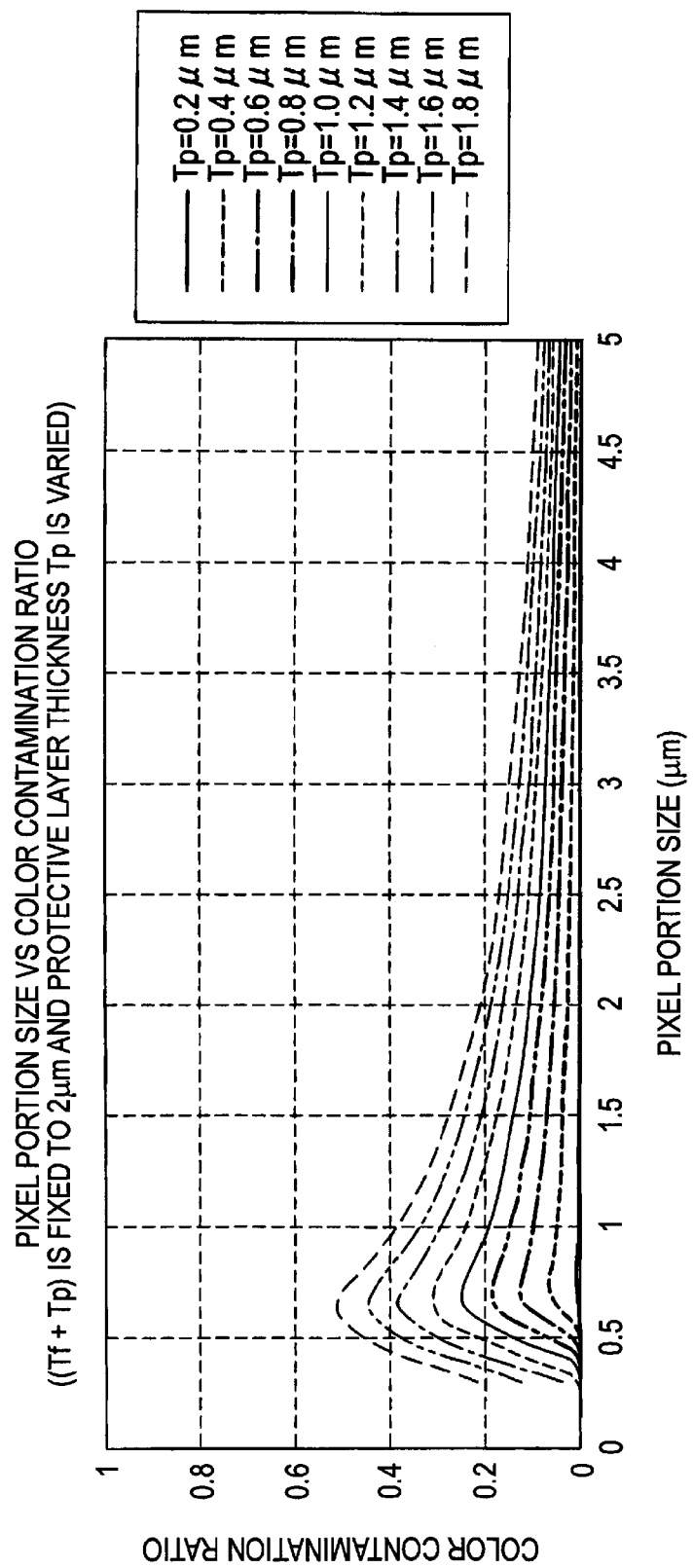
FIG. 18 is a graph showing a simulation result of the color contamination ratio in the case that Tf+Tp is fixed to 2 μm and the thickness Tp of the protective layer is varied in the configuration of FIG. 3.

(c) Case that Tf+Tp is Fixed to 2 μm and the Thickness Tp of the Protective Layer 9 is Varied FIG. 17 is a graph showing a simulation result of the efficiency of light utilization in a case that Tf+Tp is fixed to 2 μm and the thickness Tp of the protective layer 9 is varied in the configuration of FIG. 3. FIG. 18 is a graph showing a simulation result of the color contamination ratio in the case that Tf+Tp is fixed to 2 μm and the thickness Tp of the protective layer 9 is varied in the configuration of FIG. 3.

Figure 19:
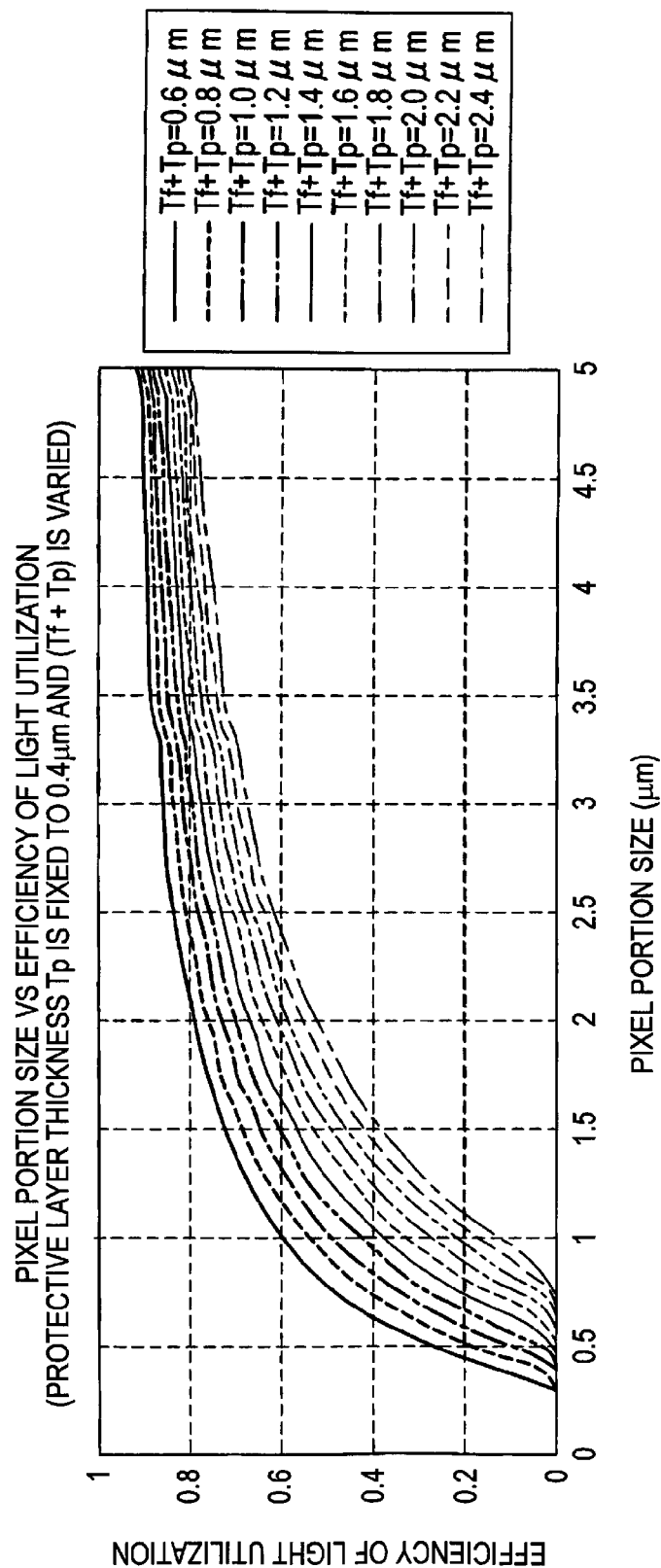
FIG. 19 is a graph showing a simulation result of the efficiency of light utilization in a case that the thickness Tp of the protective layer is fixed to 0.4 μm and Tf+Tp is varied in the configuration of FIG. 3.
Figure 20:
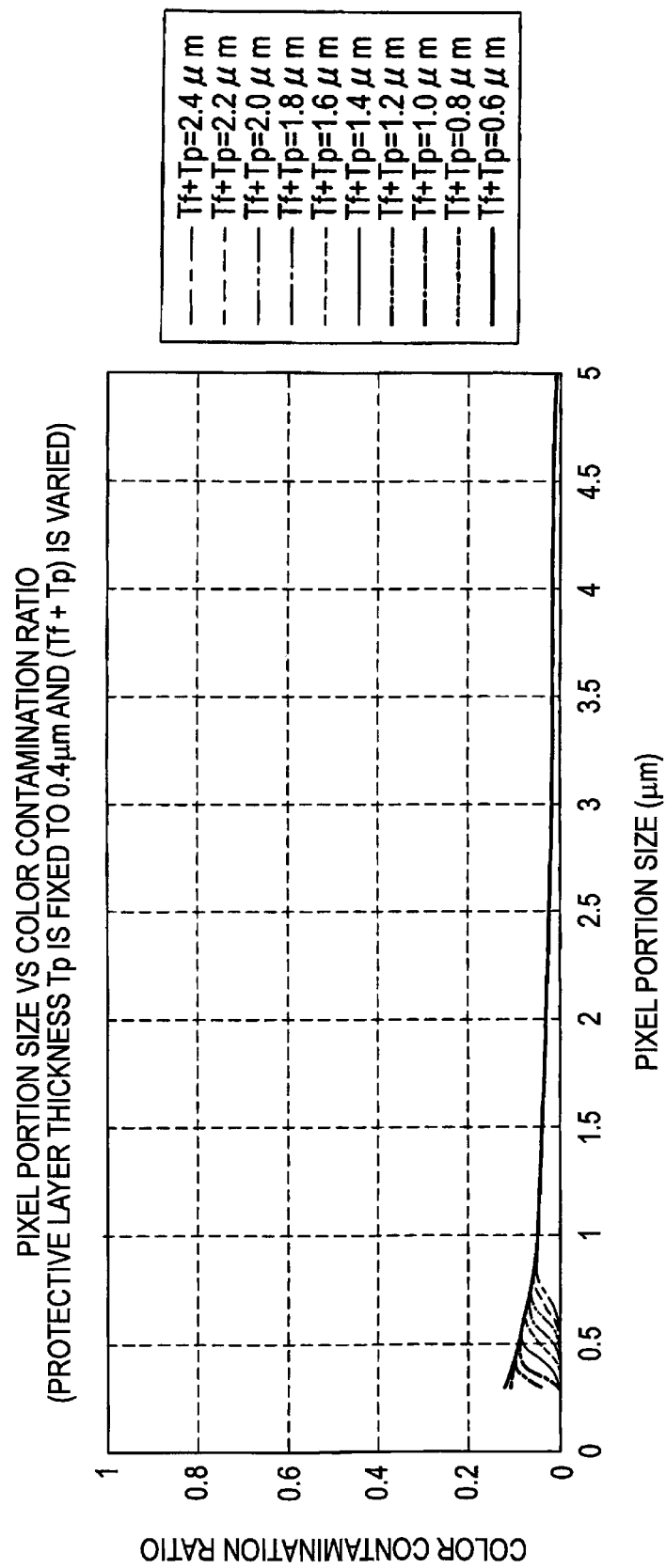
FIG. 20 is a graph showing a simulation result of the color contamination ratio in the case that the thickness Tp of the protective layer is fixed to 0.4 μm and Tf+Tp is varied in the configuration of FIG. 3.

(d) Case that the Thickness Tp of the Protective Layer 9 is Fixed to 0.4 μm and Tf+Tp is Varied FIG. 19 is a graph showing a simulation result of the efficiency of light utilization in a case that the thickness Tp of the protective layer 9 is fixed to 0.4 μm and Tf+Tp is varied in the configuration of FIG. 3. FIG. 20 is a graph showing a simulation result of the color contamination ratio in the case that the thickness Tp of the protective layer 9 is fixed to 0.4 μm and Tf+Tp is varied in the configuration of FIG. 3.

The following are seen from those results:

When the thickness Tp of the protective layer 9 is fixed, the color contamination ratio does not vary much even if the thickness Tf of the color filters 10 is varied.

When Tf+Tp is fixed, the efficiency of light utilization does not vary much even if the thickness Tp of the protective layer 9 is varied.

That is, it is seen that the color contamination ratio characteristic is determined by Tp and the light utilization efficiency characteristic is determined by Tf+Tp.

Studies were made to determine a Tp range in which the color contamination ratio is kept allowable for a solid-state imaging device and a (Tf+Tp) range in which the efficiency of light utilization is kept allowable for a solid-state imaging device.

Figure 21:
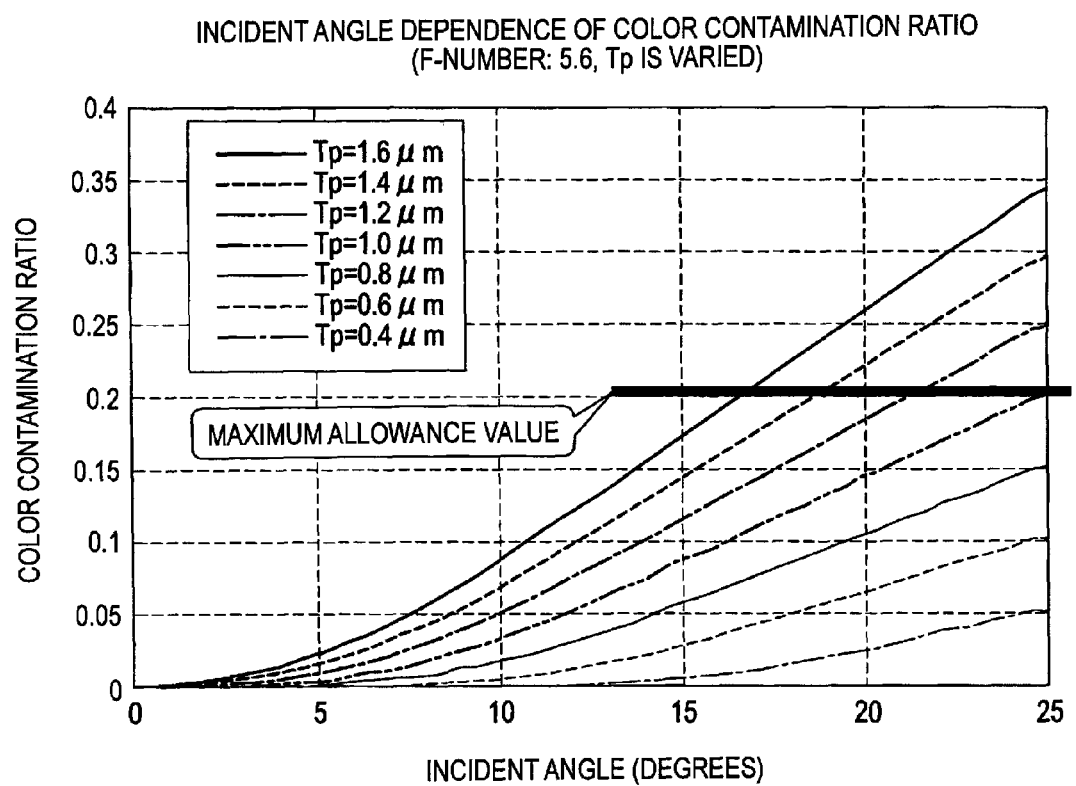
FIG. 21 is a graph showing a simulation result of the color contamination ratio in a case that the thickness Tp of the protective layer is varied in the configuration of FIG. 3.

FIG. 21 is a graph showing a simulation result of the color contamination ratio in a case that the thickness Tp of the protective layer 9 is varied in the configuration of FIG. 3. It is assumed that the color contamination ratio being smaller than or equal to 20% is allowable on condition that the incident angle is 25°, the f-number is 5.6, and the pixel portion size Pp is larger than or equal to 1 μm. This assumption is appropriate to those skilled in the art in view of the characteristics of conventional solid-state imaging devices. It is seen from the simulation result of FIG. 21 that the color contamination ratio is allowable if the thickness Tp of the protective layer 9 is smaller than or equal to 1.0 μm, preferably, in the range of 0.4 to 1.0 μm. Since the lower limit of the thickness Tp of the protective layer 9 is greater than 0 μm, it is desirable that the thickness Tp of the protective layer 9 be greater than 0 μm and smaller than or equal to 1.0 μm.

Figure 22:
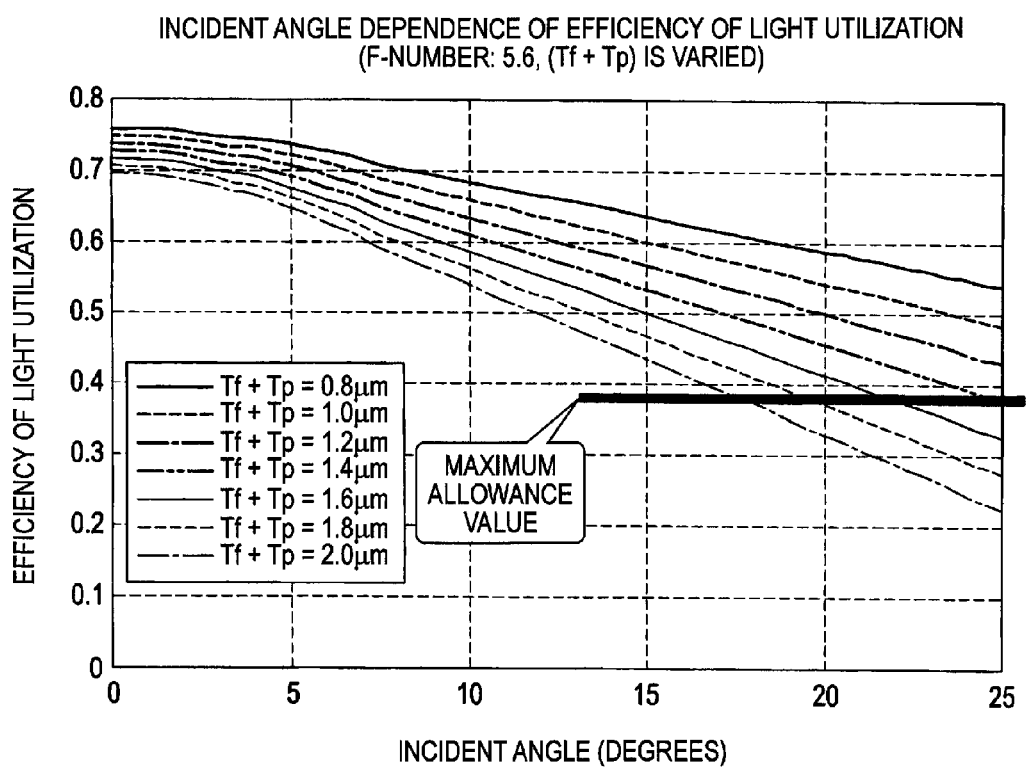
FIG. 22 is a graph showing a simulation result of the efficiency of light utilization in a case that Tf+Tp is varied in the configuration of FIG. 3.

FIG. 22 is a graph showing a simulation result of the efficiency of light utilization in a case that Tf+Tp is varied in the configuration of FIG. 3. It is assumed that the efficiency of light utilization being higher than or equal to 50% is allowable on condition that the incident angle is 25°, the f-number is 5.6, and the pixel portion size Pp is larger than or equal to 1 μm. This assumption is appropriate to those skilled in the art in view of the characteristics of conventional solid-state imaging devices. It is seen from the simulation result of FIG. 22 that the efficiency of color utilization is allowable if Tf+Tp is smaller than or equal to 1.4 μm. The thickness Tf of the color filters 10 needs to be greater than about 0.2 μm though it is determined by the absorbance of a pigment or dye as a material of the color filters 10, the degree of its dispersion in a binder, and a desired spectral transmittance characteristic. It is therefore desirable that Tf+Tp be larger than 0.2 μm and smaller than or equal to 1.4 μm.

Figure 23:
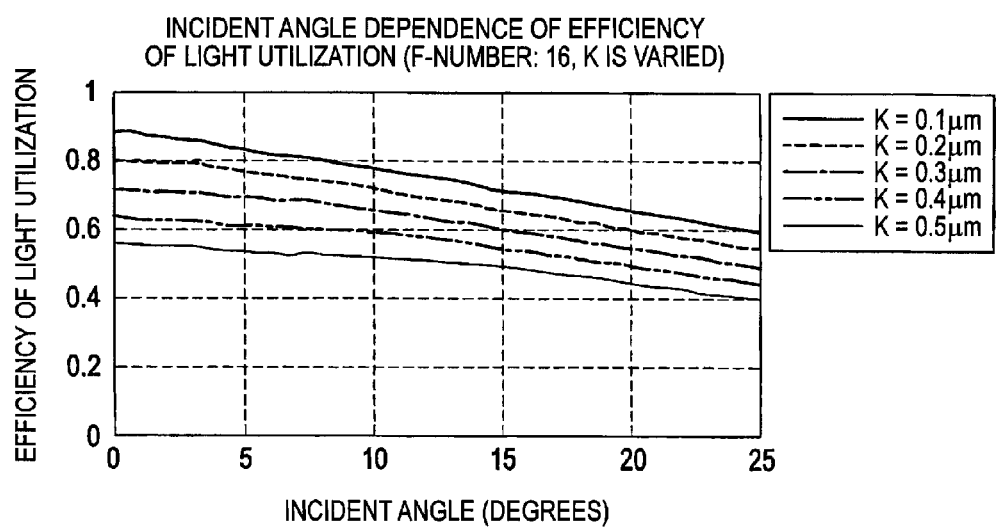
FIG. 23 is a graph showing a simulation result of the incident angle dependence of the efficiency of light utilization in a case that the pixel portion size Pp is 2 μm, f-number is 16, and the partition width K is varied.

The simulated solid-state imaging device has the partitions 11, and the partitions 11 occupy a smaller part of each pixel portion and the aperture ratio of each pixel portion increases as the width K of each partition 11 decreases. The efficiency of light utilization becomes higher as the aperture ratio increases. FIG. 23 is a graph showing a simulation result of the incident angle dependence of the efficiency of light utilization in a case that the pixel portion size Pp is 2 μm, f-number is 16, and the partition width K is varied.

If it is assumed that in a practical sense the efficiency of light utilization being higher than or equal to 0.6 is desirable when the incident angle is 0°, it is seen from the result of FIG. 23 that the partition width K needs to be smaller than or equal to 0.4 μm, that is, the ratio of the partition width K to the pixel portion size Pp be smaller than or equal to 0.2. On the other hand, the lower limit of the partition width K is determined by its material. For the partitions 11 to absorb or reflect incident light sufficiently, the partition width K needs to be greater than or equal to 0.2 μm in the case of a resist dispersed with titanium black and greater than or equal to 0.05 μm in the case of a metal. It is therefore desirable that the partition width K be in the range of 0.05 μm to 0.2 times the pixel portion size Pp.

A solid-state imaging device which is different in configuration than shown in FIG. 1A will be described below.

Figure 24:
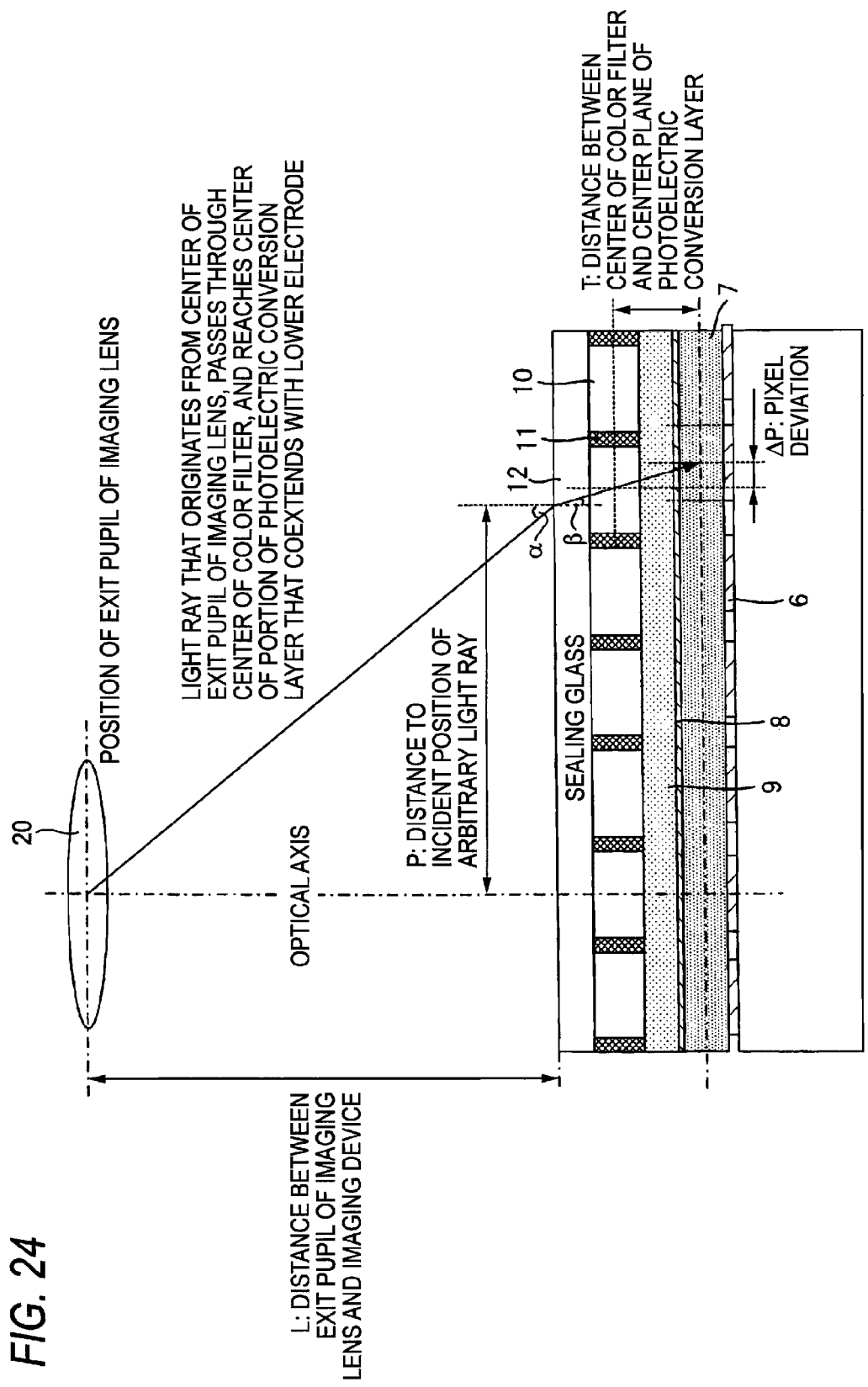
FIG. 24 shows a general configuration of an imaging apparatus incorporating a solid-state imaging device that is different in configuration than shown in FIG. 1A.

FIG. 24 shows a general configuration of an imaging apparatus incorporating a solid-state imaging device that is different in configuration than shown in FIG. 1A. In FIG. 24, the members of the solid-state imaging device that are located under the lower electrodes 6 are omitted. Members having the same members in FIG. 3 are given the same reference numerals as the latter.

The solid-state imaging device of the imaging apparatus of FIG. 24 is different from that of FIG. 1A in that the lower electrode 6 is deviated outward more from the color filter 10 of the same pixel portion as the position of the lower electrode 6 goes away from the center of the solid-state imaging device.

As shown in FIG. 24, the center of the lower electrode 6 is deviated outward from the center of the corresponding color filter 10 by ΔP so that a light ray passing through the center of the color filter 10 reaches the center of that portion of the photoelectric conversion layer 7 which is sandwiched between the lower electrode 6 and the upper electrode 8.

In the configuration in which peripheral pixel portions have the same structure as central pixel portions (i.e., the lower electrode 6 is concentric with the color filter 10), the peripheral pixel portions where the incident angle of incident light is large can detect only smaller light quantities relative to the central pixel portions. This may cause luminance shading or color shading which occurs because light incident on one pixel portion is prone to enter the adjacent pixels, in the peripheral pixel portions.

The configuration of FIG. 24 can prevent the phenomenon that the light quantity becomes insufficient in peripheral pixel portions, because the light detecting portion (i.e., that portion of the photoelectric conversion layer 7 which is sandwiched between the lower electrode 6 and the upper electrode 8) of the pixel portion is deviated outward more as the position comes closer to the periphery (this is called "pixel deviating"). As a result, the luminance shading and the color shading can be suppressed.

In general solid-state imaging devices in which color filters are provided over a semiconductor substrate in which photodiodes are formed, it is a conventional measure to suppress the luminance shading and the color shading by deviating the color filter and the photodiode more as the position goes away from the center (i.e., comes closer to the periphery). However, such general solid-state imaging devices are configured so that a light ray passing through the center of the color filter reaches the center of the photodiode surface, and hence this configuration is different from the configuration of FIG. 24. In the configuration of FIG. 24 in which a light ray passing through the center of the color filter reaches the center of the light detecting portion of the pixel portion, the efficiency of light utilization can be increased and the color contamination ratio can be reduced.

Consideration will now be given to a preferable range of the above-described pixel deviation ΔP.

In the imaging apparatus of FIG. 24, the following Equations (4) hold, where L is the distance between the exit pupil of the imaging lens 20 and the solid-state imaging device, P is the distance between the optical axis and the point of incidence, on the solid-state imaging device, of an arbitrary light ray that originates from the center of the exit pupil of the imaging lens 20, passes through the center of a color filter 10, and reaches the center of the light detecting portion (located right over the corresponding lower electrode 6) of the corresponding pixel portion, α is the incident angle of the light ray, β is the refraction angle of the light ray, T is the distance in the optical axis direction between the center of the color filter 10 and the center plane of the photoelectric conversion layer 7, and n is the refractive index of the sealing glass 12, the color filters 10, the protective layer 9, the upper electrode 8, and the photoelectric conversion layer 7.

$$\tan\alpha = \frac{P}{L}, \ \sin\alpha = n\sin\beta, \ \Delta P = T\tan\beta \tag{4}$$

For example, where L=500 μm, α=25°, T (=(½ of the thickness Tf in the optical axis direction of the color filters 10)+(the thickness Tp of the protective layer 9)+(½ of the thickness To in the optical axis direction of the photoelectric conversion layer 7)=1.65 μm, and the refractive index n=1.5, P, β, and ΔP are calculated as 233 μm, 16.36°, and 0.484 μm, respectively. Therefore, the ideal ratio of the pixel deviation ΔP of an arbitrary pixel portion to the distance P between the optical axis and the arbitrary pixel portion is calculated as ΔP/P≅0.002.

Values of the color contamination ratio and the efficiency of light utilization obtained with ΔP/P being approximately equal to 0.002 were calculated by the same ray-trace simulation method as described above. In simulations, since the solid-state imaging device has the sealing glass 12, values of the color contamination ratio and the efficiency of light utilization were calculated by having an arbitrary point in the top surface of the sealing glass 12 represented by (x5, G) (G: the thickness in the optical direction of the sealing glass 12) and calculating a post-refraction locus of a light ray incident on the top surface of the sealing glass 12 in the above-described manner.

Simulations were performed and values of the color contamination ratio and the efficiency of light utilization were calculated for a case that the lower electrode 6 is deviated toward the periphery of the solid-state imaging device from the center of the color filter 10 surrounded by the partitions 11 by ΔP=0.002P and a case that the lower electrode 6 is not deviated under conditions that the f-number of the imaging lens 20 is 5.6, L is 500 μm, the pixel portion size Pp=2 μm, the pixel portion size $P_p$ is 2 μm, the width K of the partitions 11 is 0.1 μm, the thickness Tf in the optical axis direction of the color filters 10 is 1 μm, the thickness Tp in the optical axis direction of the protective layer 9 is 1 μm, the thickness To in the optical axis direction of the photoelectric conversion layer 7 is 0.3 μm, and the width Pa of the lower electrodes 6 is 1.9 μm.

Figure 25:
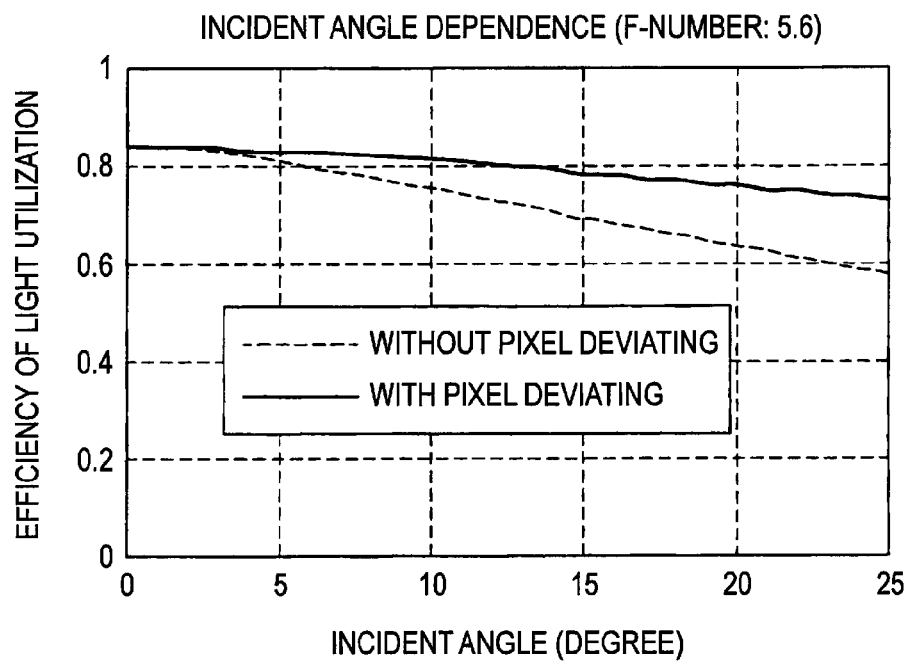
FIG. 25 is a graph showing a simulation result of the efficiency of light utilization of a case with pixel deviating and a case without the pixel deviating in the configuration of FIG. 24.
Figure 26:
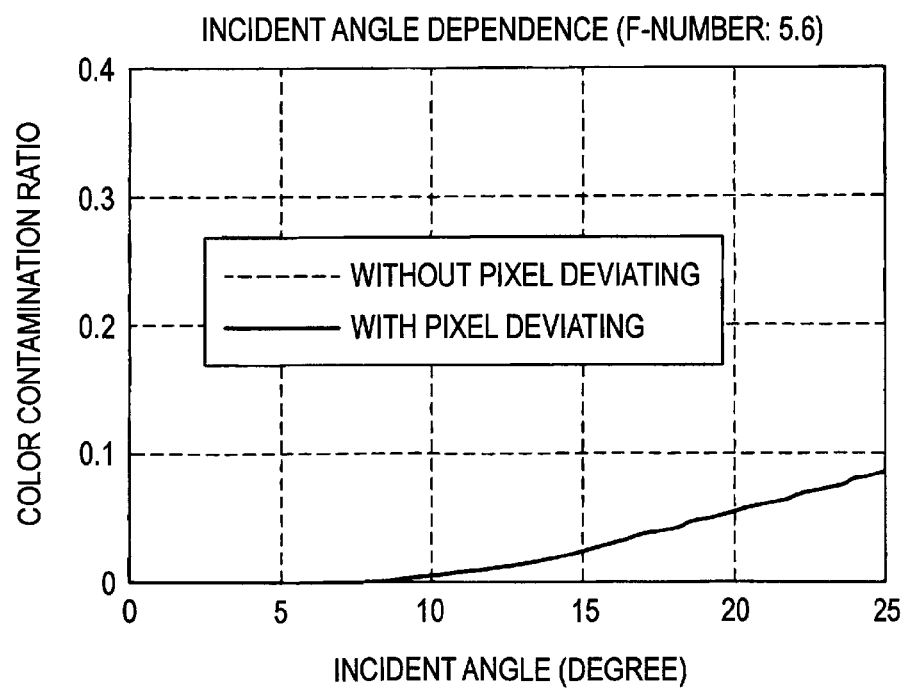
FIG. 26 is a graph showing a simulation result of the color contamination ratio of the case with the pixel deviating and the case without the pixel deviating in the configuration of FIG. 24.

FIG. 25 is a graph showing a simulation result of the efficiency of light utilization of the case with the pixel deviating and the case without the pixel deviating. FIG. 26 is a graph showing a simulation result of the color contamination ratio of the case with the pixel deviating and the case without the pixel deviating.

As seen from FIG. 25, the luminance shading (the phenomenon that the efficiency of light utilization decreases as the incident angle increases) is clearly improved by the pixel deviating. On the other hand, as for the color shading (the phenomenon that the color contamination increases as the incident angle increases), there are almost no differences between the case with the pixel deviating and the case without the pixel deviating. We consider that this is because under the above conditions the color contamination suppressing effect is already attained by the partitions 11.

Calculations were performed to determine how the efficiency of light utilization and the color contamination ratio vary when ΔP/P is varied and the incident angle is fixed to 25° under the same conditions as mentioned above. Results are shown in FIGS. 27 and 28.

Figure 27:
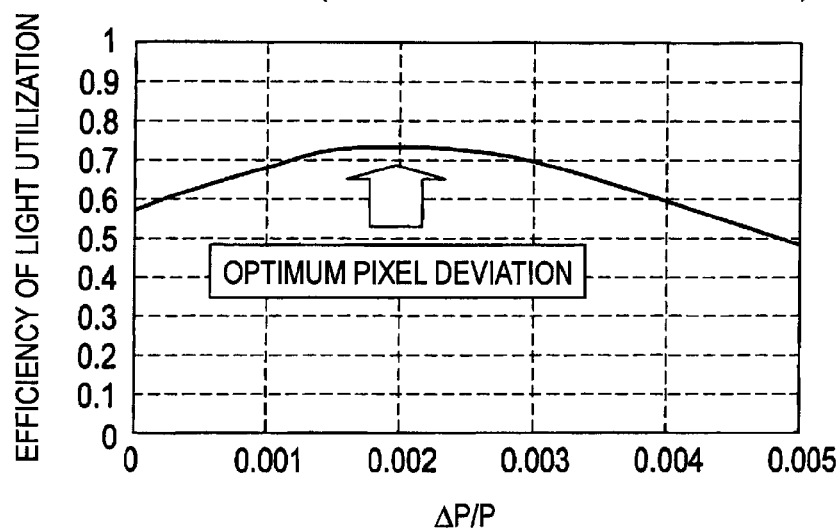
FIG. 27 is a graph showing a simulation result of the efficiency of light utilization in a case that ΔP/P is varied and the incident angle is fixed to 25° in the configuration of FIG. 24.
Figure 28:
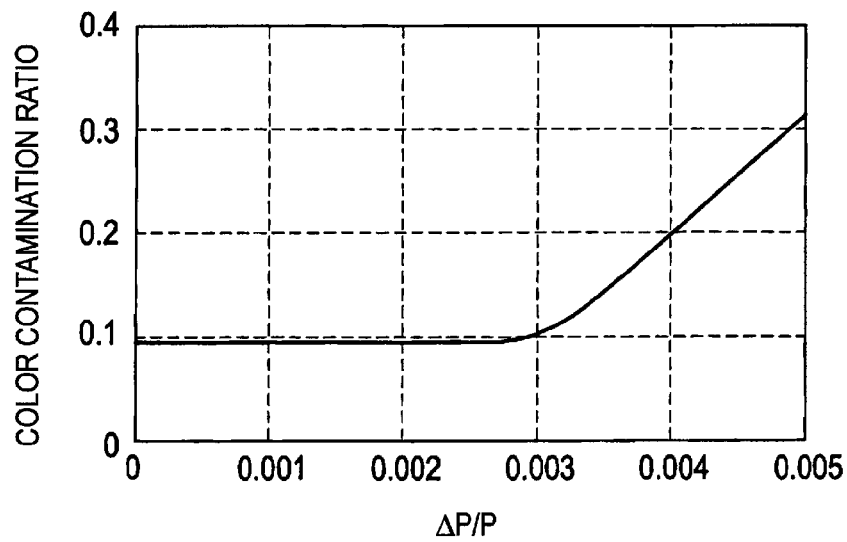
FIG. 28 is a graph showing a simulation result of the color contamination ratio in the case that ΔP/P is varied and the incident angle is fixed to 25° in the configuration of FIG. 24.

It is seen from FIGS. 27 and 28 that highest efficiency of light utilization (minimum luminance shading) and smallest color contamination ratios (minimum color shading) are obtained in the ΔP/P range of 0.001 to 0.0032 when the incident angle is fixed to 25°.

From Equations (4), a relationship $$\Delta P/P = \frac{T\tan\beta}{L\tan\alpha} \approx \frac{T\sin\beta}{L\sin\alpha} = \frac{T}{Ln}$$

is obtained. Therefore, when n=1.5, we obtain ΔP/P=0.667T/L.

On the other hand, the simulations under the conditions L=500 μm, T=1.65 μm, n=1.5, and α (incident angle)=25° show that the efficiency of light utilization is within the range of about a 5% reduction from the maximum value (i.e., the efficiency of light utilization is kept approximately equal to the maximum value) when ΔP/P is in the range of 0.001 to 0.0032 (see FIG. 27), and that the color contamination ratio remains the same as the maximum value when ΔP/P is in the range of 0 to 0.003 (see FIG. 28).

In FIGS. 27 and 28, the horizontal axis represents ΔP/P. Since L=500 μm and T=1.65 μm, that is, T/L=0.0033, the following conversions can be made: ΔP/P=0.001≅0.303T/L, ΔP/P=0.0032≅0.97T/L, and ΔP/P=0=0×T/L, and ΔP/P=0.003≅0.909T/L.

Based on the above ΔP/P conversion equations and the above-described simulation results, we conclude that it is desirable that the ratio of ΔP (the deviation, from the center of the color filter 10 of an arbitrary pixel portion, of the center of the corresponding lower electrode 6) to P (the distance between the intersection of a light ray passing through the center of the color filter 10 of the arbitrary pixel portion and the top surface of the solid-state imaging device (i.e., the top surface of the sealing glass 12) and the intersection of the top surface of the solid-state imaging device and the optical axis) be in the range of 0.303T/L to 0.909T/L.

Microlenses for focusing light in the photoelectric conversion layer 7 may be provided on the color filters 10 of the pixel portions, respectively, of each of the solid-state imaging devices of FIGS. 1 and 24. The use of the microlenses makes it possible to further suppress the light leakage between the pixel portions and, as a result, the color shading and the luminance shading.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A solid-state imaging device, comprising:
   a substrate; and
   a plurality of pixel portions arranged over the substrate, wherein:
   each of the pixel portions includes a photoelectric conversion portion provided over the substrate and a color filter provided over the photoelectric conversion portion;
   the solid-state imaging device includes partitions for preventing light that is incident on the color filter of each pixel portion from entering adjacent pixel portions;
   the partitions are provided between the color filters of the adjoining pixel portions so as to cover side surfaces of the color filters;
   each of the photoelectric conversion portions includes a lower electrode provided over the substrate, an upper electrode provided over the lower electrode, and a photoelectric conversion layer provided between the lower electrode and the upper electrode;
   each of the pixel portions further includes a protective layer provided between the color filter and the upper electrode, for protecting the photoelectric conversion portion; and
   the protective layer has a thickness of greater than 0 μm and smaller than or equal to 1.0 μm; and
   wherein a width of each of the partitions in a direction that is parallel with surfaces of the color filters is in a range of from 0.05 μm to 0.2 times a size of each of the pixel portions; and
   a sum of a thickness of the color filters and the thickness of the protective layer is greater than 0.2 μm and smaller than or equal to 1.4 μm.

2. The solid-state imaging device according to claim 1, wherein the partitions are made from a light absorbing or reflecting material or are air layers that reflect light totally.

3. The solid-state imaging device according to claim 1, wherein the lower electrode is deviated outward more from the color filter of the same pixel portion as the position of the lower electrode goes away from a center of the solid-state imaging device.

4. The solid-state imaging device according to claim 3, wherein the lower electrode is deviated outward so that a light ray that originates from a center of an exit pupil of an imaging lens of an imaging apparatus incorporating the solid-state imaging device and passes through a center of the color filter of the pixel portion reaches a center of a portion of the photoelectric conversion layer that is sandwiched between the lower electrode and the upper electrode of the same pixel portion.

5. The solid-state imaging device according to claim 4, wherein a deviation of a center of the lower electrode from a center of the color filter of the same pixel portion is longer than or equal to 0.303T/L times a distance between an intersection of the light ray and a top surface of the solid-state imaging device and an optical axis of the imaging lens and shorter than or equal to 0.909T/L times the distance between the intersection of the light ray and the surface of the solid-state imaging device and the optical axis of the imaging lens, where L is a distance between the exit pupil of the imaging lens and the top surface of the solid-state imaging device and T is a distance between the center of the color filter and a center plane of the photoelectric conversion layer.

6. The solid-state imaging device according to claim 1, wherein:
   the photoelectric conversion layer is made from a photoelectric conversion material that absorbs visible light and generates signal charges corresponding to an amount of the absorbed light; and
   the color filters of the pixel portions include three or more kinds of color filters that transmit light components in different wavelength ranges.

7. The solid-state imaging device according to claim 1, wherein the photoelectric conversion layer is made from an organic or inorganic photoelectric conversion material.

8. The solid-state imaging device according to claim 1, wherein each of the pixel portions further comprises a microlens provided over the color filter, for focusing light in the photoelectric conversion portion.

9. An imaging apparatus comprising the solid-state imaging device according to claim 1.

* * * * *